United States Patent
Chen

(10) Patent No.: US 12,501,682 B2
(45) Date of Patent: Dec. 16, 2025

(54) SEMICONDUCTOR DEVICE AND FABRICATION METHOD THEREOF

(71) Applicant: Ark HDPS Semiconductor Pte. LIMITED., Singapore (SG)

(72) Inventor: Chin-Fu Chen, Hsinchu County (TW)

(73) Assignee: Ark HDPS Semiconductor Pte. LIMITED., Singapore (SG)

( * ) Notice: Subject to any disclaimer, the term of this patent is extended or adjusted under 35 U.S.C. 154(b) by 369 days.

(21) Appl. No.: 18/125,140

(22) Filed: Mar. 23, 2023

(65) Prior Publication Data

US 2023/0326982 A1    Oct. 12, 2023

(30) Foreign Application Priority Data

Apr. 7, 2022   (CN) .................. 202210361607.7
Dec. 5, 2022   (CN) .................. 202211550535.7

(51) Int. Cl.
*H10D 64/00*   (2025.01)
*H10D 30/01*   (2025.01)
(Continued)

(52) U.S. Cl.
CPC ....... *H10D 64/112* (2025.01); *H10D 30/0289* (2025.01); *H10D 30/65* (2025.01); *H10D 30/658* (2025.01); *H10D 62/107* (2025.01); *H10D 62/393* (2025.01); *H10D 64/01* (2025.01); *H10D 64/117* (2025.01); *H10D 84/0167* (2025.01); *H10D 84/0179* (2025.01);
(Continued)

(58) Field of Classification Search
None
See application file for complete search history.

(56) References Cited

U.S. PATENT DOCUMENTS

| 7,576,388 B1 | 8/2009 | Wilson |
| 8,546,880 B2 | 10/2013 | Lee |

(Continued)

FOREIGN PATENT DOCUMENTS

| CN | 106169503 | 11/2016 |
| CN | 114050187 A | 2/2022 |
| TW | 202341476 A | 10/2023 |

OTHER PUBLICATIONS

Cortes "The thin SOI TGLDMOS transistor: a suitable power structure for low voltage applications", Semicond. Sci. Technol. 22(2007)1183-1188, Sep. 21, 2007.

(Continued)

*Primary Examiner* — Bilkis Jahan
(74) *Attorney, Agent, or Firm* — Winston Hsu

(57) ABSTRACT

A semiconductor device includes a substrate having a first conductivity type, a well region having a second conductivity type and disposed on the substrate, a first trench and a second trench disposed in the well region. In addition, a first field plate and a first dielectric layer surrounding the first field plate are disposed in the first trench. A second field plate and a second dielectric layer surrounding the second field plate are disposed in the second trench. A first gate is disposed above the first field plate. A source electrode is disposed on a first side of the first trench, and a drain electrode is disposed on a second side of the second trench. The source electrode, the first trench, the second trench and the drain electrode are sequentially arranged along a first direction.

20 Claims, 20 Drawing Sheets

(51) Int. Cl.
*H10D 30/65* (2025.01)
*H10D 62/10* (2025.01)
*H10D 62/17* (2025.01)
*H10D 64/01* (2025.01)
*H10D 84/01* (2025.01)
*H10D 84/03* (2025.01)
*H10D 84/85* (2025.01)

(52) U.S. Cl.
CPC ......... *H10D 84/038* (2025.01); *H10D 84/859* (2025.01)

(56) References Cited

U.S. PATENT DOCUMENTS

| | | | |
|---|---|---|---|
| 9,059,281 B2 | 6/2015 | Brochu, Jr. et al. | |
| 9,553,184 B2* | 1/2017 | Zitouni | H10D 62/153 |
| 10,038,061 B2 | 7/2018 | Ning | |
| 10,811,502 B1* | 10/2020 | Khemka | H01L 21/31111 |
| 2006/0131647 A1 | 6/2006 | Meyer | |
| 2013/0302958 A1* | 11/2013 | Hossain | H10D 30/0295 |
| | | | 438/270 |
| 2016/0064546 A1* | 3/2016 | Zitouni | H10D 64/513 |
| | | | 257/334 |
| 2016/0322489 A1* | 11/2016 | Siemieniec | H10D 64/518 |
| 2020/0066714 A1 | 2/2020 | Qiao | |
| 2021/0280680 A1 | 9/2021 | Xu | |
| 2021/0320200 A1 | 10/2021 | Saxena | |

OTHER PUBLICATIONS

Lei, "Performance analysis of a novel trench SOI LDMOS with centrosymmetric double vertical field plates", Results in Physics 12(2019)810-815, Dec. 12, 2018.

* cited by examiner

SEMICONDUCTOR DEVICE AND FABRICATION METHOD THEREOF

BACKGROUND OF THE INVENTION

1. Field of the Invention

The present disclosure relates generally to integrated circuit technology, and more particularly to integrated circuit structures including laterally-diffused trench metal-oxide-semiconductor devices and fabrication methods thereof.

2. Description of the Prior Art

Metal-oxide-semiconductor field-effect transistors (MOSFETs) are devices commonly used in integrated circuits, which include a lateral device such as a laterally-diffused metal-oxide-semiconductor (LDMOS) field-effect transistor (FET), and a vertical device such as a planar gate MOSFET or a trench gate MOSFET. In order to withstand high voltage, the length of the field plate and the length of the drift region may be enlarged in the LDMOS FET, or the depth of the trench may be enlarged in the trench gate MOSFET. However, these manners will increase the size of the device, cause the process of the device to be compatible with other devices, and increase the difficulty of the process. Therefore, the industry needs MOS devices that can satisfy the requirements of integrated circuits in all aspects.

SUMMARY OF THE INVENTION

In view of this, the present disclosure provides an integrated circuit structure including a laterally-diffused trench metal-oxide-semiconductor device and a fabrication method thereof, where a power integrated circuit process integration technology such as a Bipolar-CMOS-DMOS (BCD) process is used to simultaneously form a laterally-diffused trench metal-oxide-semiconductor (trench LDMOS) device, a laterally-diffused metal-oxide-semiconductor (LDMOS) device and a complementary metal-oxide-semiconductor (CMOS) device on the same semiconductor substrate. Moreover, in the trench LDMOS device, the depth of the trench is reduced, the difficulty of the process is reduced, the breakdown voltage is increased, and the on-state resistance is reduced.

According to one embodiment of the present disclosure, a semiconductor device is provided and includes a substrate, a well region, a first trench, a second trench, a first gate, a source electrode and a drain electrode. The substrate has a first conductivity type. The well region has a second conductivity type and is disposed on the substrate. The first trench and the second trench are disposed in the well region. A first field plate and a first dielectric layer are disposed in the first trench, where the first dielectric layer surrounds the first field plate. A second field plate and a second dielectric layer are disposed in the second trench, where the second dielectric layer surrounds the second field plate. The first gate is disposed above the first field plate. The source electrode is disposed on a first side of the first trench. The drain electrode is disposed on a second side of the second trench. In addition, the source electrode, the first trench, the second trench and the drain electrode are arranged in sequence along a first direction.

According to one embodiment of the present disclosure, a method of fabricating a semiconductor device is provided and includes the following steps. A substrate having a first conductivity type is provided and a well region having a second conductivity type is formed on the substrate. A first trench and a second trench are formed in the well region. A dielectric layer is conformally deposited in the first trench and the second trench. The first trench and the second trench are filled up with a conductive layer on the dielectric layer. The conductive layer in the first trench and the second trench is etched to form a first recess on a first field plate and a second recess on a second field plate, respectively. The first recess and the second recess are filled up with a dielectric material to form a first dielectric isolation portion and a second dielectric isolation portion, respectively. The dielectric layer and the first dielectric isolation portion in the first trench are etched to form a first groove. A first gate is formed in the first groove. In addition, a source region and a drain region are formed in the well region, where the source region is located on a first side of the first trench, and the drain region is located on a second side of the second trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
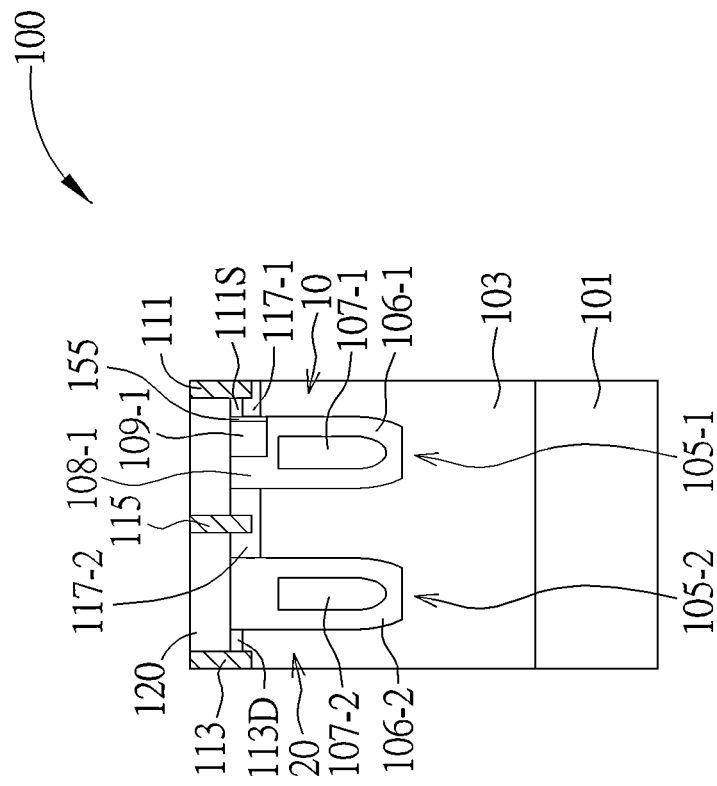
FIG. 1 is a schematic cross-sectional view of a semiconductor device according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to an integrated circuit structure including a trench LDMOS device and a fabrication method thereof, where a power integrated circuit process integration technology such as a Bipolar-CMOS-DMOS (BCD) process is used to simultaneously form a trench LDMOS device, a LDMOS device and a CMOS device on the same semiconductor substrate. Moreover, in the trench LDMOS device, the depth of trench is reduced, the difficulty of process is reduced, the breakdown voltage is increased and the on-state resistance is reduced.

FIG. 1 is a schematic cross-sectional view of a semiconductor device according to an embodiment of the present disclosure. As shown in FIG. 1, in one embodiment, a semiconductor device 100 includes a substrate 101 having a first conductivity type, such as a p-type silicon substrate. A well region 103 is disposed on the substrate 101. The well region 103 has a second conductivity type that is opposite to the first conductivity type. The well region 103 is for example, a deep n-type well (DNW) or an n-type silicon epitaxial layer (N-epi). The semiconductor device 100 further includes a first trench 105-1 and a second trench 105-2 disposed in the well region 103. A first field plate 107-1 and a first dielectric layer 106-1 are disposed in the first trench 105-1, where the first dielectric layer 106-1 surrounds the first field plate 107-1. A second field plate 107-2 and a second dielectric layer 106-2 are disposed in the second trench 105-2, where the second dielectric layer 106-2 surrounds the second field plate 107-2. In this embodiment, a first gate 109-1 is also disposed in the first trench 105-1 and located above the first field plate 107-1. The first gate 109-1 and the first field plate 107-1 are separated by a first dielectric isolation portion 108-1. The first dielectric isolation portion 108-1 covers the first field plate 107-1, and the first gate 109-1 may be disposed in the first dielectric isolation portion 108-1. When viewed in a direction (for example, a Z-axis direction) perpendicular to the surface of the substrate 101, the first gate 109-1 and the first field plate 107-1 may not be aligned with each other. For example, the first gate 109-1 may be shifted to the right (for example, along an X-axis direction) compared to the first field plate 107-1. In some embodiments, the first gate 109-1, the first field plate 107-1 and the second field plate 107-2 may be formed of the same conductive material, such as polysilicon, doped polysilicon, metal silicide, metal or other conductive materials. The first dielectric layer 106-1, the second dielectric layer 106-2 and the first dielectric isolation portion 108-1 may be formed of the same dielectric material, such as silicon oxide, silicon nitride, silicon oxynitride or dielectric materials of a high dielectric constant.

In addition, the semiconductor device 100 further includes a first body region 117-1 disposed on a first side 10 of the first trench 105-1, and a second body region 117-2 disposed between the first trench 105-1 and the second trench 105-2. The first body region 117-1 and the second body region 117-2 both have the first conductivity type, for example, both are p-type body regions (p-body), and the dopant concentrations of the first conductivity type dopants in the first body region 117-1 and the second body region 117-2 both are greater than the dopant concentration of the second conductivity type dopant in the well region 103. The first body region 117-1 and the second body region 117-2 are formed in the well region 103 and near to the top surface of the well region 103. The bottom surfaces of the first body region 117-1 and the second body region 117-2 both are higher than the top surface of the first field plate 107-1. The semiconductor device 100 further includes a source region 111S disposed in the first body region 117-1 and near to the top surface of the first body region 117-1, and a drain region 113D disposed in the well region 103 on the second side 20 of the second trench 105-2 and near to the top surface of the well region 103. In addition, the semiconductor device 100 further includes an interlayer dielectric (ILD) layer 120 covering the well region 103. A source electrode 111 is disposed to pass through the ILD layer 120, extended downward into the first body region 117-1, and adjacent to and electrically coupled to the source region 111S. A drain electrode 113 is disposed to pass through the ILD layer 120, extended downward into the well region 103, and is adjacent to and electrically coupled to the drain region 113D. A field plate contact 115 is disposed to pass through the ILD layer 120, extended downward into the second body region 117-2, and electrically coupled to the second body region 117-2. In this embodiment, the source electrode 111 is disposed on the first side 10 of the first trench 105-1, and the drain electrode 113 is disposed on the second side 20 of the second trench 105-2. In addition, along a first direction (for example, from right to left in the X-axis direction), the source electrode 111, the first trench 105-1, the second trench 105-2 and the drain electrode 113 are arranged in sequence. Furthermore, in some embodiments, the potential of the first field plate 107-1 may be the same as the potential of the first gate 109-1 (for example, both are a positive potential), or the potential of the first field plate 107-1 may be the same as the potential of the source electrode 111 (for example, both are a ground potential).

Figure 20:
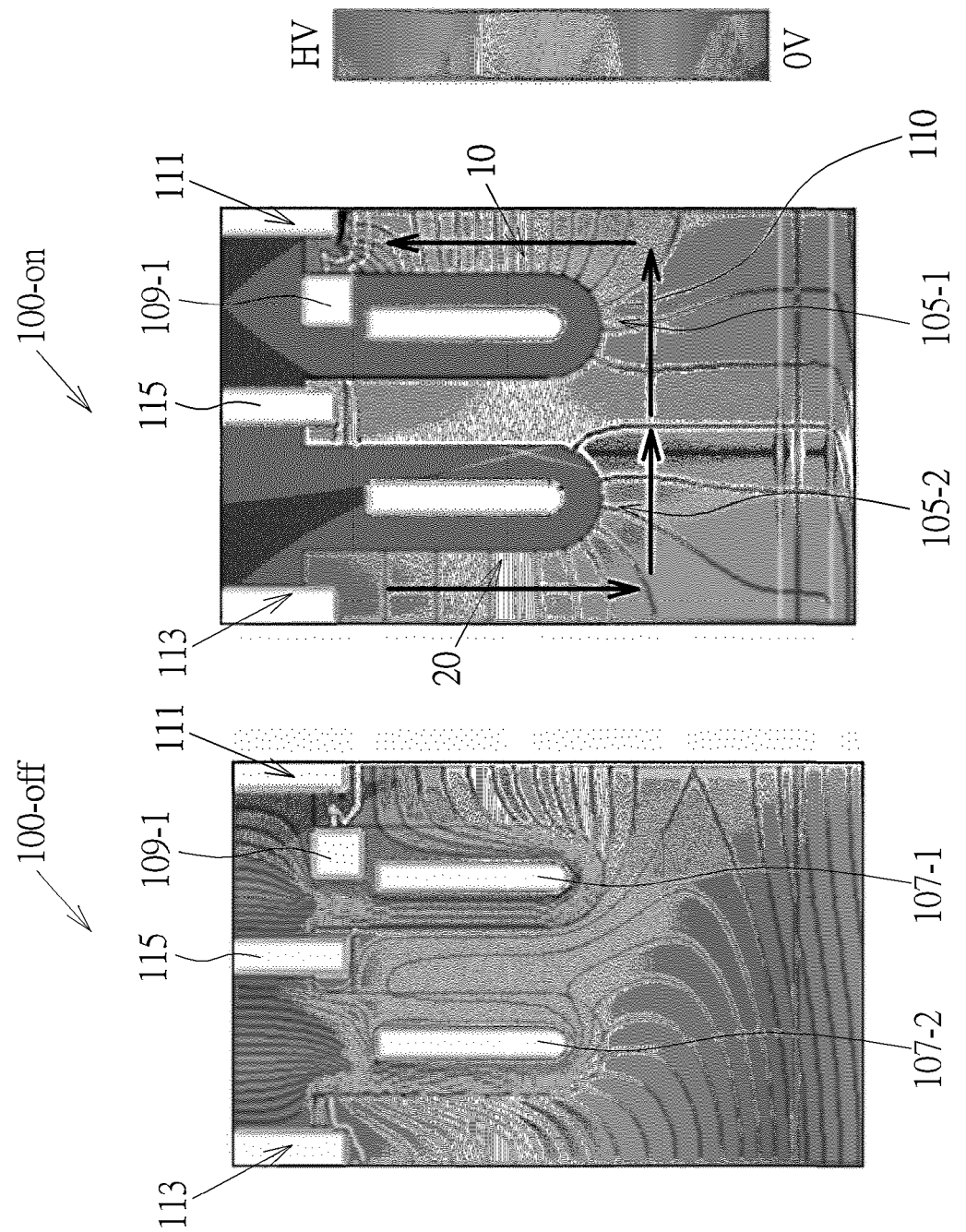
FIG. 20 is a schematic diagram illustrating distributions of voltage equipotential lines of a semiconductor device in an off state and in an on state, respectively, according to an embodiment of the present disclosure.

Referring to both FIG. 1 and FIG. 20, according to an embodiment of the present disclosure, a gate dielectric layer 155 is disposed between the first gate 109-1 and the first body region 117-1. When a specific bias voltage (for example, a positive potential) is applied to the first gate 109-1, the conductivity of the first body region 117-1 adjacent to the gate dielectric layer 155 is increased to form a conduction channel. According to an embodiment of the present disclosure, when the first gate 109-1 is applied with a turn-on bias voltage (for example, a positive potential), a conduction channel is formed in the first body region 117-1. When the first field plate 107-1 and the second field plate 107-2 are applied with a positive potential, the distribution of electric field or potential in the well region 103 around the first trench 105-1 and the second trench 105-2 is adjusted to avoid a high-intensity electric field in a local area. Therefore, during the operation of the semiconductor device 100, current is allowed to flow from the drain electrode 113, downward along the second side 20 of the second trench 105-2 to be below the second trench 105-2, and to be below the first trench 105-1, and then upward along the first side 10 of the first trench 105-1 through the conduction channel in the first body region 117-1, and finally to the source electrode 111, so that the semiconductor device 100 of the present disclosure has a U-shaped current path 110. In addition, with the second body region 117-2 disposed between the first trench 105-1 and the second trench 105-2, since the conductivity type of the second body region 117-2 is different from that of the well region 103, during the operation of the semiconductor device 100, the current will not flow into the second body region 117-2 from the well region 103. Moreover, a potential is applied to the second body region 117-2 through the field plate contact 115, so that the distribution of electric field or potential in the well region 103 below the second body region 117-2 may also be regulated. In the embodiments of the present disclosure, a PN junction is between the substrate 101 and the well region 103, so that the first side 10 of the first trench 105-1 and the second side 20 of the second trench 105-2 both can disperse the voltage to make the voltage drop to be more evenly distributed on the current path. Furthermore, even though the depths of the first trench 105-1 and the second trench 105-2 are reduced, the semiconductor device 100 can still achieve the same withstand voltage capability as that achieved by a single extremely deep trench. According to the embodiments of the present disclosure, since the first trench 105-1 and the second trench 105-2 have reduced depths, in addition to reduce the difficulty of the process of fabricating the semiconductor device 100, it can also avoid the stress of deep trenches on the wafer during the fabrication of the semiconductor devices, which is beneficial to the BCD process and the process yield of the semiconductor devices is also improved.

Figure 2:
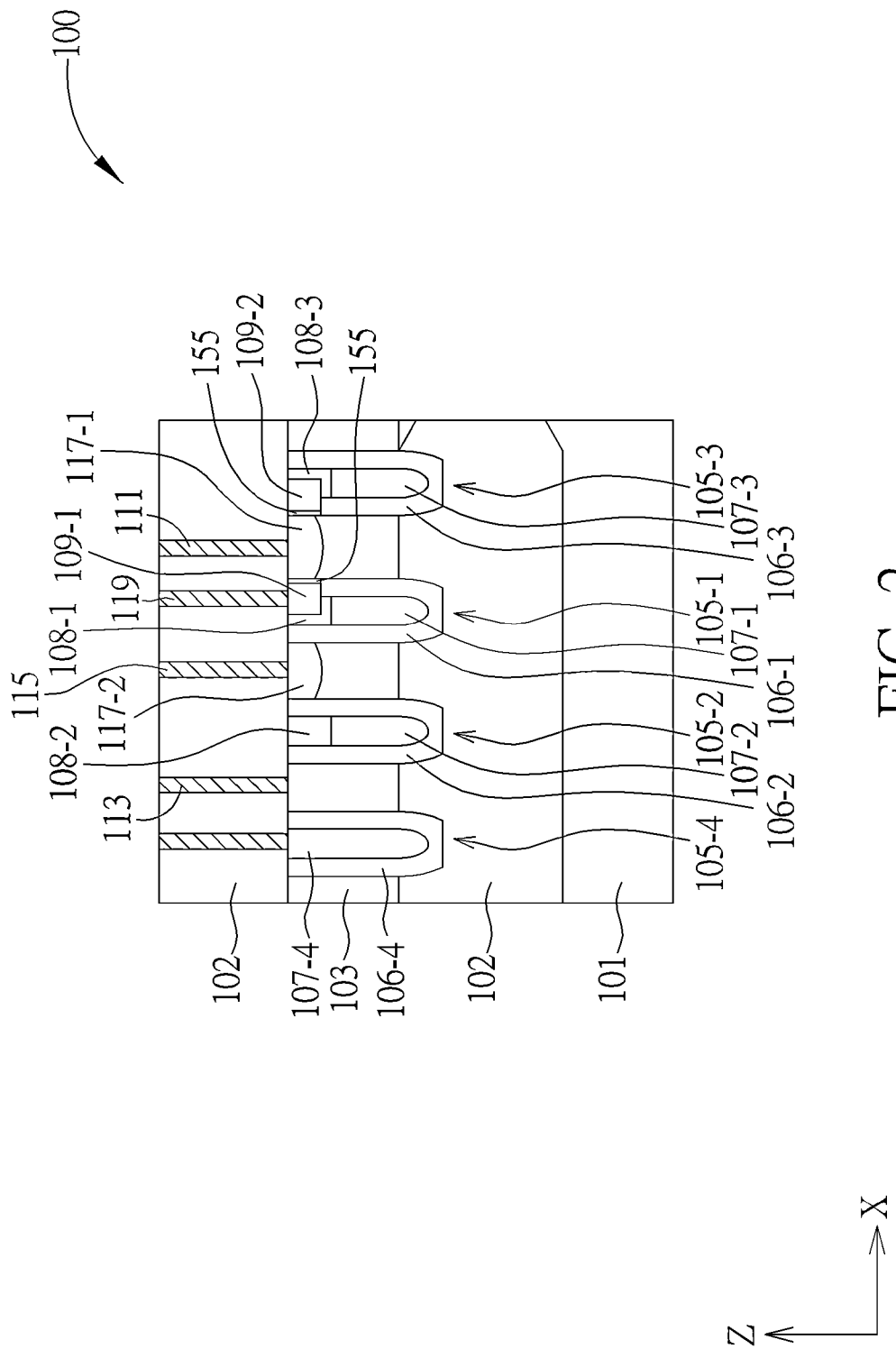
FIG. 2 is a schematic cross-sectional view of a semiconductor device according to another embodiment of the present disclosure.

FIG. 2 is a schematic cross-sectional view of a semiconductor device according to another embodiment of the present disclosure. As shown in FIG. 2, in one embodiment, a semiconductor device 100 may further include a buried layer 102 disposed below the well region 103. For example, the buried layer 102 is disposed between the well region 103 and the substrate 101. The buried layer 102 has the second conductivity type, for example, an n-type buried layer (NBL). In this embodiment, the semiconductor device 100 further includes a third trench 105-3 and a fourth trench 105-4. The first trench 105-1, the second trench 105-2, the third trench 105-3 and the fourth trench 105-4 are all disposed in the well region 103, extended downward into the buried layer 102, and do not penetrate the bottom surface of the buried layer 102. In the second trench 105-2, a second dielectric isolation portion 108-2 covers the second field plate 107-2. A third field plate 107-3 and a third dielectric layer 106-3 are disposed in the third trench 105-3, where the third dielectric layer 106-3 surrounds the third field plate 107-3. A second gate 109-2 is disposed in the third trench 105-3 and separated from the third field plate 107-3 by a third dielectric isolation portion 108-3. The third dielectric isolation portion 108-3 covers the third field plate 107-3. The second gate 109-2 is disposed in the third dielectric isolation portion 108-3. When viewed in a direction (for example, the Z-axis direction) perpendicular to the surface of the substrate 101, the second gate 109-2 and the third field plate 107-3 may not be aligned with each other, for example, the second gate 109-2 is shifted to the left compared to the third field plate 107-3. In addition, a gate dielectric layer 155 is disposed between the second gate 109-2 and the first body region 117-1. A fourth field plate 107-4 and a fourth dielectric layer 106-4 are disposed in the fourth trench 105-4, where the fourth dielectric layer 106-4 surrounds the fourth field plate 107-4. The source electrode 111 is disposed between the first trench 105-1 and the third trenches 105-3. The drain electrode 113 is disposed between the fourth trench 105-4 and the second trench 105-2. Moreover, along the first direction (for example, from right to left in the X-axis direction), the third trench 105-3, the source electrode 111, the first trench 105-1, the second trench 105-2, the drain electrode 113 and the fourth trench 105-4 are arranged in sequence. In this embodiment, the top surface of the fourth field plate 107-4 is higher than all the top surfaces of the first field plate 107-1, the second field plate 107-2 and the third field plate 107-3. In other embodiments, the top surface of the fourth field plate 107-4 may be at the same level with all the top surfaces of the first field plate 107-1, the second field plate 107-2, and the third field plate 107-3. In addition, a gate contact 119 is disposed to pass through the ILD layer 120, and is adjacent to and electrically coupled to the first gate 109-1. The other components of the semiconductor device 100 of FIG. 2 may refer to the related descriptions of the components with the same reference numerals in FIG. 1, which will not be repeated here.

Figure 3:
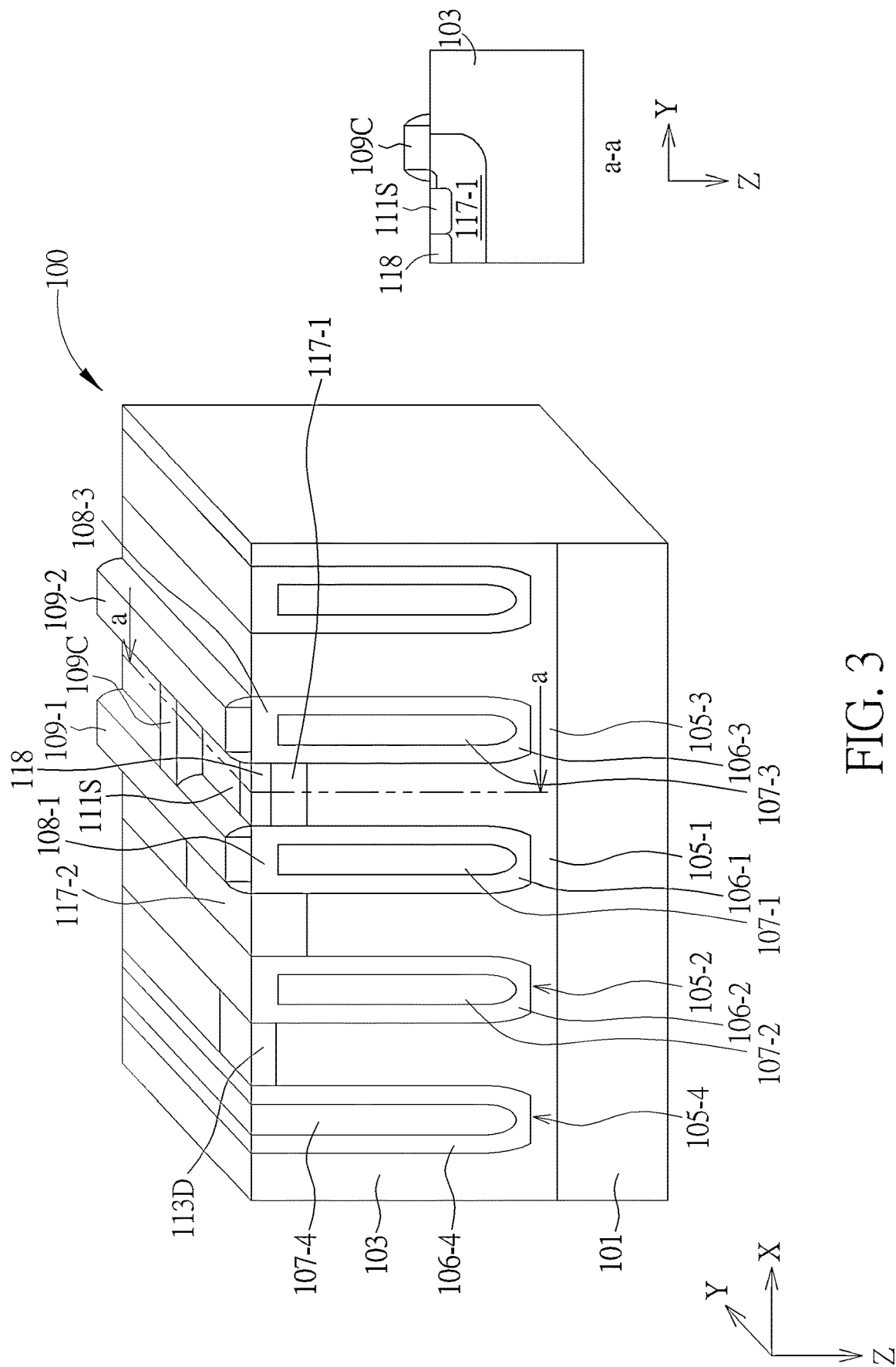
FIG. 3 shows a schematic perspective view of a semiconductor device and a schematic cross-sectional view of a local area of the semiconductor device according to another embodiment of the present disclosure.

FIG. 3 shows a schematic perspective view of a semiconductor device and a schematic cross-sectional view of a local area of the semiconductor device according to another embodiment of the present disclosure. As shown in FIG. 3, in one embodiment, a semiconductor device 100 includes a third trench 105-3 and a first trench 105-1, a second trench 105-2 and a fourth trench 105-4 that are arranged in sequence along the first direction (for example, from right to left in the X-axis direction). These trenches are all disposed in the well region 103, and the third trench 105-3, the first trench 105-1, the second trench 105-2 and the fourth trench 105-4 include a third field plate 107-3, a first field plate 107-1, a second field plate 107-2 and a fourth field plate 107-4, respectively. These field plates are surrounded by a third dielectric layer 106-3, a first dielectric layer 106-1, a second dielectric layer 106-2, and a fourth dielectric layer 106-4, respectively, in these trenches. In addition, in some embodiments, the top surface of the fourth field plate 107-4 may be higher than all the top surfaces of the first field plate 107-1, the second field plate 107-2 and the third field plate 107-3. The first dielectric isolation portion 108-1 covers the first field plate 107-1. The third dielectric isolation portion 108-3 covers the third field plate 107-3. Both the top surfaces of the first dielectric isolation portion 108-1 and the third dielectric isolation portion 108-3 may be level with the top surface of the fourth field plate 107-4.

In addition, the semiconductor device 100 of FIG. 3 further includes a first gate 109-1 disposed on the top surface of the first dielectric isolation portion 108-1, and a second gate 109-2 disposed on the top surface of the third dielectric isolation portion 108-3. The long axes of the first gate 109-1 and the second gate 109-2 are extended substantially along the second direction (for example, the Y-axis direction). In this embodiment, the first gate 109-1 and the second gate 109-2 both are disposed on the well region 103. The semiconductor device 100 of FIG. 3 further includes a gate connecting portion 109C, which is extended from a sidewall of the first gate 109-1 along the first direction (for example, the X-axis direction) to protrude beyond the sidewall of the first gate 109-1, and extended to a sidewall of the second gate 109-2. The gate connecting portion 109C is also disposed on the well region 103. As shown in FIG. 3, the first gate 109-1, the second gate 109-2 and the gate connecting portion 109C constitute an H-shaped structure on the XY plane. The gate connecting portion 109C is disposed between the first gate 109-1 and the second gate 109-2. In addition, spacers may be disposed on respective two opposite outer sidewalls of the first gate 109-1, the second gate 109-2 and the gate connection portion 109C.

Furthermore, FIG. 3 also shows a schematic cross-sectional view of a local area of the semiconductor device 100 along the sectional line a-a. As shown in FIG. 3, the semiconductor device 100 further includes a body region, such as a first body region 117-1, which is disposed under the gate connecting portion 109C. The first body region 117-1 is extended along a second direction (for example, the Y-axis direction), protrudes from a position below one side of the gate connecting portion 109C, and is located between the upper portions of the first trench 105-1 and the third trench 105-3. The semiconductor device 100 further includes a second body region 117-2 located between the first trench 105-1 and the second trench 105-2. Both the first body region 117-1 and the second body region 117-2 have the first conductivity type, for example, p-type body regions, and both are disposed in the well region 103 of the second conductivity type. In addition, the semiconductor device 100 further includes a source region 111S that is disposed between the first trench 105-1, the third trench 105-3 and the gate connecting portion 109C. Three sides of the source region 111S are adjacent to the first trench 105-1, the third trench 105-3 and the gate connecting portion 109C, respectively. Moreover, a heavily doped region 118 of the first conductivity type, such as a p-type heavily doped region (P+ region), may be further disposed in the first body region 117-1. The dopant concentration of the heavily doped region 118 is greater than the dopant concentration of the first body region 117-1. The heavily doped region 118 is adjacent to the source region 111S, and the first body region 117-1 is extended below the source region 111S and the heavily doped region 118. During the operation of the semiconductor device 100, the heavily doped region 118 and the source region 111S may be electrically coupled to the same potential (for example, a ground potential), but not limited thereto.

As shown in FIG. 3, the semiconductor device 100 further includes a drain region 113D located between the second trench 105-2 and the fourth trench 105-4, and disposed in the well region 103. Both the drain region 113D and the source region 111S are doped regions of the second conductivity type, such as n-type doped regions. In this embodiment, the first gate 109-1, the second gate 109-2 and the gate connecting portion 109C constitute a planar gate structure. The first gate 109-1, the second gate 109-2 and the gate connecting portion 109C may be formed of polysilicon, doped polysilicon, metal or other conductive materials by deposition, photolithography and etching processes at the same time. In addition, the long-axis extension direction (the second direction, such as the Y-axis direction) of the first gate 109-1 and the second gate 109-2 and the long-axis extension direction (the first direction, such as the X-axis direction) of the gate connection portion 109C may have an included angle of non-zero degrees, for example, an included angle of about 90 degrees, but not limited thereto. In the embodiment of FIG. 3, the channel region of the semiconductor device 100 is located under a portion of the planar gate structure constructed by the gate connecting portion 109C, and is located in the first body region 117-1 under the gate connecting portion 109C. Either of the first gate 109-1 and the second gate 109-2 may be used as a wire structure for transmitting electrical signals to the gate connection portion 109C. According to the embodiment of the present disclosure, the first gate 109-1 and the second gate 109-2 are disposed directly above the first trench 105-1 and the third trench 105-3, respectively, and may be extended along the same direction (for example, the Y-axis direction) of the corresponding trench, so that the first gate 109-1 and the second gate 109-2 are prevented from occupying an additional area of the wafer. Furthermore, the other components of the semiconductor device 100 of FIG. 3 may refer to the related descriptions of the components with the same reference numerals in FIG. 1, which will not be repeated here.

Figure 4:
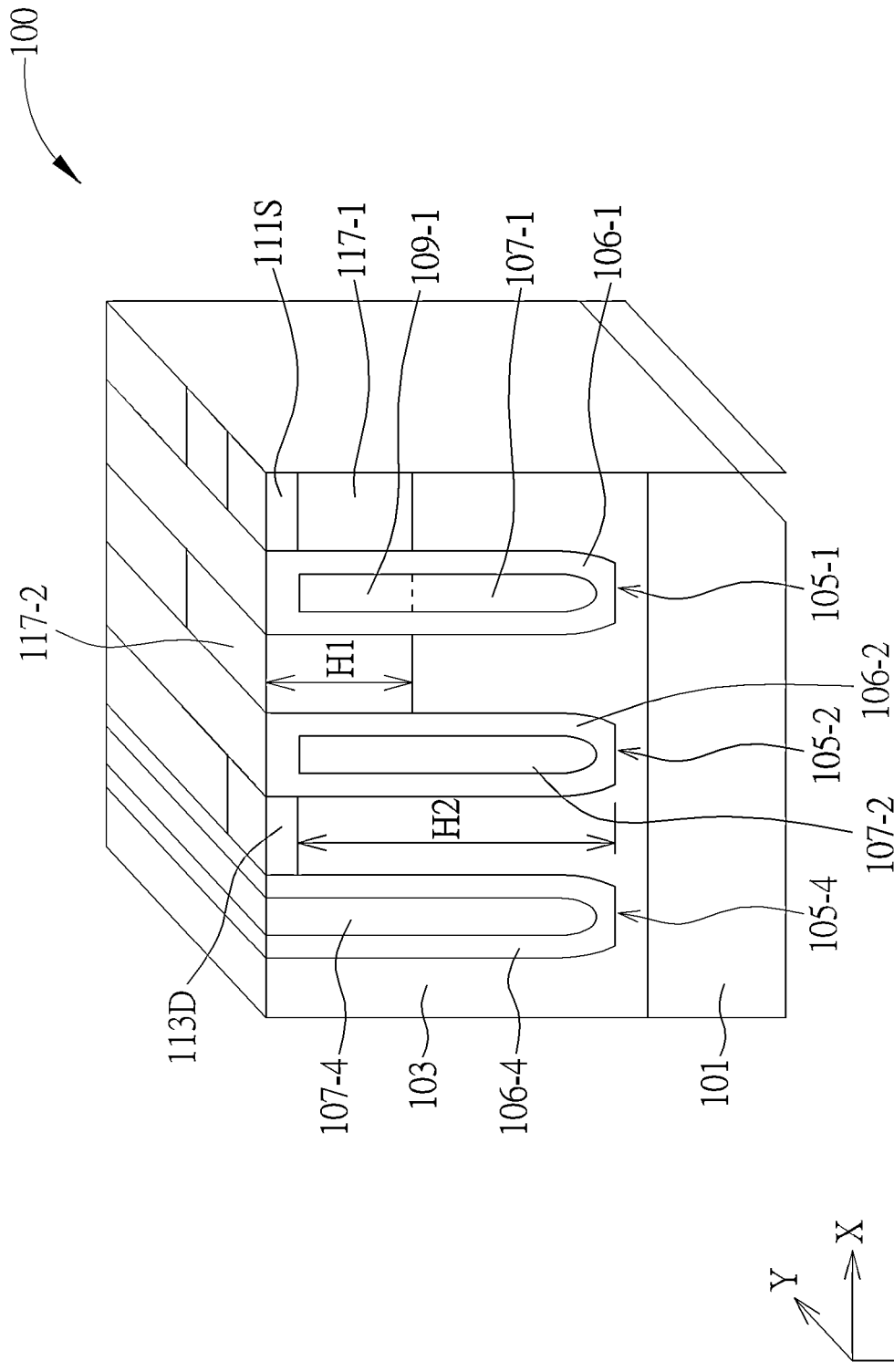
FIG. 4 is a schematic perspective view of a semiconductor device according to another embodiment of the present disclosure.

FIG. 4 is a schematic perspective view of a semiconductor device according to another embodiment of the present disclosure. As shown in FIG. 4, in this embodiment, the first gate 109-1 and the first field plate 107-1 of the semiconductor device 100 are connected to each other without being separated by a dielectric isolation portion, and the first gate 109-1 and the first field plate 107-1 are respectively composed of different regions of the same conductive layer in the first trench 105-1. The conductive layer is, for example, polysilicon, doped polysilicon, metal silicide, metal or other conductive materials. The potential of the first field plate 107-1 may be the same as the potential of the first gate 109-1 (for example, both are a positive potential). In this embodiment, a first body region 117-1 and a second body region 117-2 are disposed in the well region 103 along two opposite sides of the first trench 105-1. The first body region 117-1 is adjacent to one side of the first trench 105-1 and the second body region 117-2 is adjacent to another side of the first trench 105-1. The second body region 117-2 is disposed between the first trench 105-1 and the second trench 105-2. Both the first body region 117-1 and the second body region 117-2 have the first conductivity type, such as p-type body regions. In some embodiments, the first body region 117-1 and the second body region 117-2 both are extended downward from the height of the top of the first trench 105-1 with a depth H1. The depth H1 is, for example, about 0.3 micrometers (μm) to about 2 μm. A depth H2 of the first trench 105-1 is, for example, about 0.5 μm to about 10 μm. In some embodiments, the depth H1 of the first body region 117-1 and the second bod region 117-2 may be about 3% to about 60% of the depth H2 of the first trench 105-1, but not limited thereto. In the embodiment of FIG. 4, the channel region (not shown) of the semiconductor device 100 is located on the side of the first gate 109-1 in the first trench 105-1, and is located in the first body region 117-1. In addition, the other components of the semiconductor device 100 of FIG. 4 may refer to the related descriptions of the components with the same reference numerals in FIG. 1, which will not be repeated here.

Figure 5:
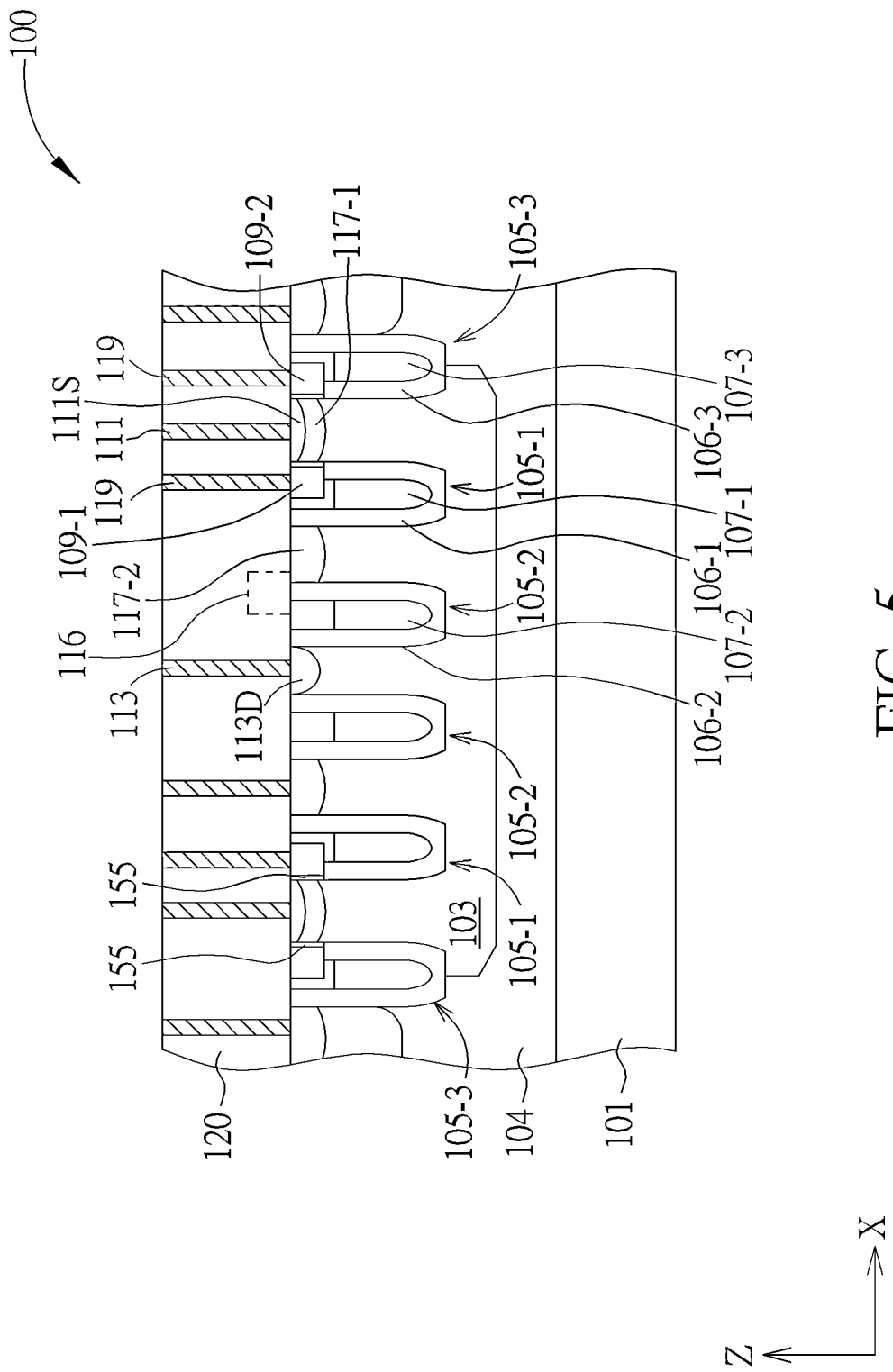
FIG. 5 is a schematic cross-sectional view of a semiconductor device according to another embodiment of the present disclosure.

FIG. 5 is a schematic cross-sectional view of a semiconductor device according to another embodiment of the present disclosure. As shown in FIG. 5, in one embodiment, a semiconductor device 100 may include an epitaxial layer 104 of the first conductivity type, for example a p-type epitaxial layer, disposed on a substrate 101 of the first conductivity type. A well region 103 of the second conductivity type, for example an n-type well region, is disposed in the epitaxial layer 104. In this embodiment, the semiconductor device 100 is constructed by taking a drain electrode 113 as the mirror symmetry center, a second trench 105-2, a second body region 117-2, a first trench 105-1, a first body region 117-1 and a third trench 105-3 are arranged in sequence along the first direction (for example, the X-axis direction) toward the right and left. A source region 111S is disposed in the first body region 117-1, and a drain region 113D is disposed between two adjacent second trenches 105-2. A first gate 109-1, a first field plate 107-1 and a first dielectric layer 106-1 are disposed in the first trench 105-1. A second gate 109-2, a third field plate 107-3 and a third dielectric layer 106-3 are disposed in the third trench 105-3. A gate dielectric layer 155 is disposed between the first gate 109-1, the first body region 117-1 and the source region 111S. Another gate dielectric layer 155 is disposed between the second gate 109-2, the first body region 117-1 and the source region 111S. The second field plate 107-2 and the second dielectric layer 106-2 are disposed in the second trench 105-2. In addition, the second field plate 107-2 and the second body region 117-2 may be electrically coupled to an interconnection structure 116, so that the second field plate 107-2 and the second body region 117-2 may be electrically coupled with each other. A source electrode 111, a drain electrode 113, gate contacts 119 and the interconnection structure 116 all are disposed in the ILD layer 120. The source electrode 111 is electrically coupled to the source region 111S, and the drain electrode 113 is electrically coupled to the drain region 113D. The two gate contacts 119 are electrically coupled to the first gate 109-1 and the second gate 109-2, respectively. The other components of the semiconductor device 100 of FIG. 5 may refer to the related descriptions of the components with the same reference numerals in FIG. 2, which are not repeated here.

Figure 6:
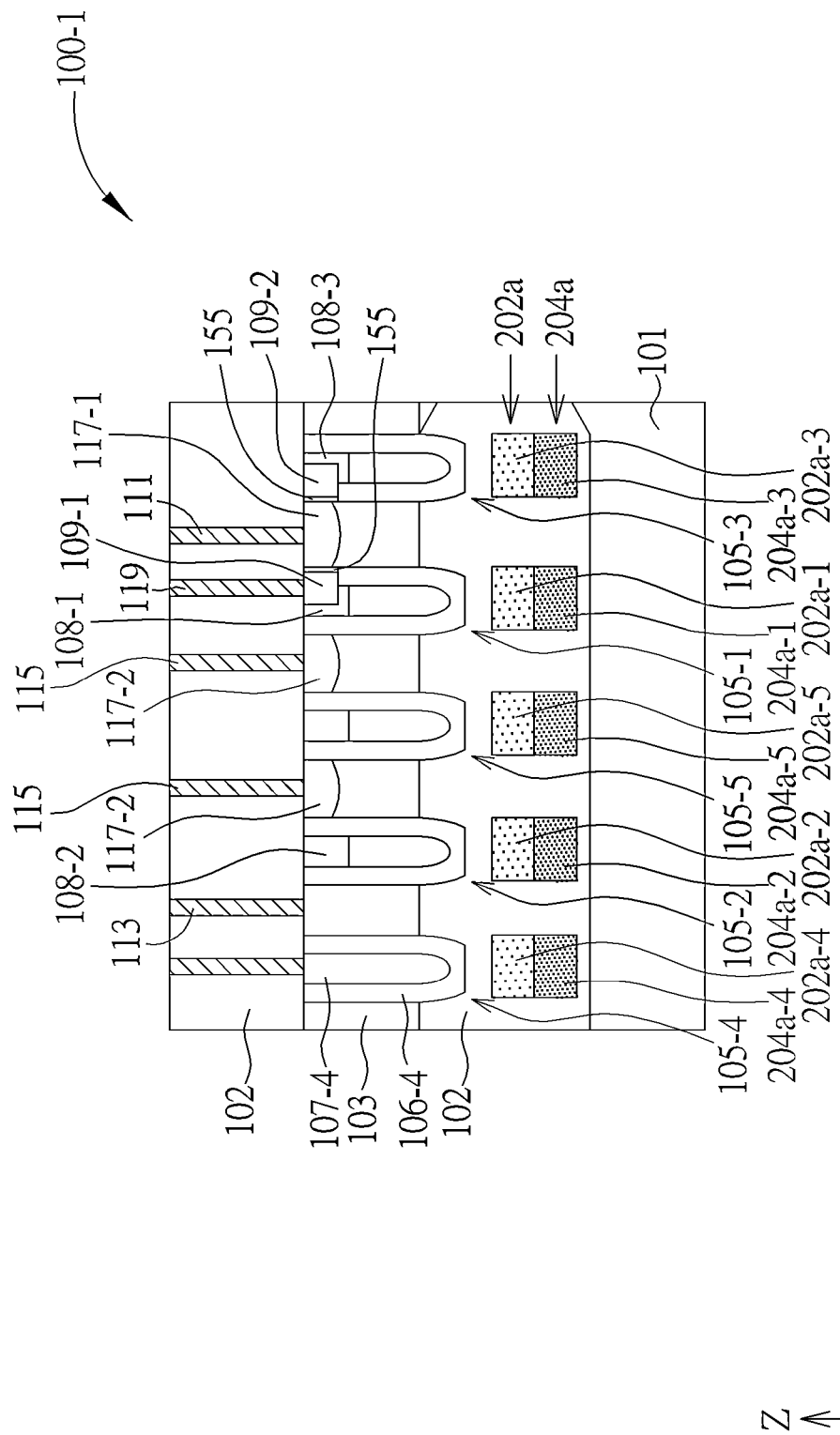
FIG. 6 is a schematic cross-sectional view of a semiconductor device according to another embodiment of the present disclosure.

FIG. 6 is a schematic cross-sectional view of a semiconductor device according to another embodiment of the present disclosure. As shown in FIG. 6, in one embodiment, a semiconductor device 100-1 includes the first trench 105-1 to the fourth trench 105-4 as shown in FIG. 2, and further includes a fifth trench 105-5 disposed between the first trench 105-1 and the second trench 105-2. The fifth trench 105-5 is disposed in the well region 103. In addition, for the semiconductor device 100-1 including the buried layer 102, the bottom of the fifth trench 105-5 is further extended into the buried layer 102.

Furthermore, multiple doped regions with different conductivity types and arranged in pairs, for example, first doped regions 202*a*-1, 202*a*-2, 202*a*-3, 202*a*-4, 202*a*-5 with the second conductivity type, and second doped regions 204*a*-1, 204*a*-2, 204*a*-3, 204*a*-4, 204*a*-5 with the first conductivity type are disposed below each of the trenches 105-1 to 105-5. According to an embodiment, the first doped regions 202*a*-1, 202*a*-2, 202*a*-5 are located in the buried layer 102, and the first doped regions 202*a*-1, 202*a*-2, 202*a*-5 are disposed below the first trench 105-1, the second trench 105-2 and the fifth trench 105-5, respectively. The first doped regions 202*a*-1, 202*a*-2, 202*a*-5 may be located at substantially the same depth and arranged into a first row 202*a*. The second doped regions 204*a*-1, 204*a*-2, 204*a*-5 are located in the buried layer 102, and the second doped regions 204*a*-1, 204*a*-2, 204*a*-5 are disposed under the first doped regions 202*a*-1, 202*a*-2, 202*a*-5, respectively. The second doped regions 204*a*-1, 204*a*-2, 204*a*-5 may be located at substantially the same depth and arranged into a second row 202b. According to an embodiment of the present disclosure, when viewed along the depth direction of the trenches 105-1 to 105-5 (for example, the Z-axis direction), the projections of the first doped regions 202a-1, 202a-2 and 202a-5 partially overlap with the projections of the first trench 105-1, the second trench 105-2 and the fifth trench 105-5, respectively, and the projections of the second doped regions 204a-1, 204a-2 and 204a-5 also partially overlap with the projections of the first trench 105-1, the second trench 105-2 and the fifth trench 105-5, respectively.

According to an embodiment of the present disclosure, each of the first doped regions 202a-1 to 202a-5 located in the first row 202a may be adjacent to each of the second doped regions 204a-1 to 204a-5 located in the second row 202b, so that each of the first doped regions 202a-1 to 202a-5 and each of the adjacent second doped regions 204a-1 to 204a-5 are in contact with each other. In addition, the ratio of the width (i.e., the dimension along the X-axis direction) of each of the first doped regions 202a-1 to 202a-5 to the width of each of the adjacent second doped regions 204a-1 to 204a-5 is between 0.5 and 2, for example, between 0.9 and 1.1. The average doping concentration of the first doped regions 202a-1 to 202a-5 and/or the average doping concentration of the second doped regions 204a-1 to 204a-5 are higher than the doping concentrations of the buried layer 102 and the well region 103. The ratio of the average doping concentration of the first doped regions 202a-1 to 202a-5 to the average doping concentration of the second doped regions 204a-1 to 204a-5 is between 0.1 and 10, for example between 0.9 and 1.1. Through properly adjusting the ratio of the widths and the ratio of the doping concentrations between the first doped regions 202a-1 to 202a-5 and the second doped regions 204a-1 to 204a-5, the first doped regions 202a-1 to 202a-5 in the first row 202a and the second doped regions 204a-1 to 204a-5 in the second row 202b may construct a structure similar to a super junction, which is beneficial to further reduce the on-state resistance ($R_{ON}$) and enhance the breakdown voltage ($V_{BR}$) of the semiconductor device 100-1.

Figure 7:
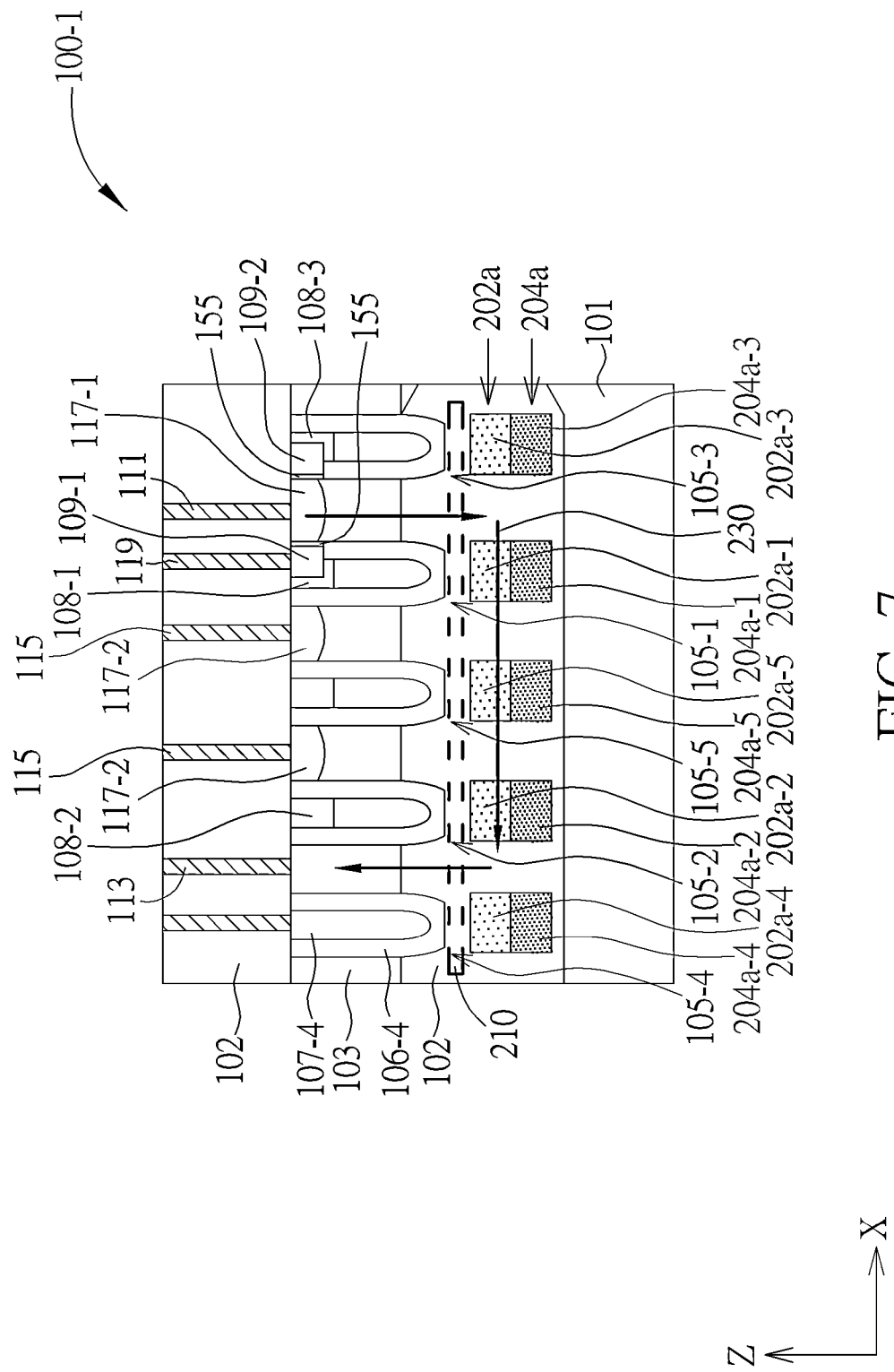
FIG. 7 is a schematic cross-sectional view of a semiconductor device in an on state according to an embodiment of the present disclosure.

FIG. 7 is a schematic cross-sectional view of a semiconductor device in an on state according to an embodiment of the present disclosure. As shown in FIG. 7, taking the semiconductor device 100-1 as an example, when the first gate electrode 109-1 is applied with a turn-on bias voltage and the semiconductor device 100-1 is in the on state, a part of the current 230 will flow from the source region (not shown), and then sequentially flow through the well region 103, the buried layer 102, the first doped region 202a-1, the buried layer 102, the first doped region 202a-5, the buried layer 102, the first doped region 202a-2, the buried layer 102, the well region 103, and finally flow to the drain region 113D (not shown). Since the conductivity type of the first doped regions 202a-1, 202a-2, 202a-5 is the same as that of the buried layer 102, and the average doping concentration of the first doped regions 202a-1, 202a-2, 202a-5 is higher than the average doping concentration of the buried layer 102, the semiconductor device 100-1 may have a lower on-state resistance ($R_{ON}$) than that of other semiconductor devices without the first doped regions 202a-1, 202a-2, 202a-5. According to an embodiment, when the semiconductor device 100-1 is in the on state, a bias voltage (such as a positive bias voltage) may also be applied to each field plate in each trench 105-1 to 105-5 at the same time, so that an inversion layer 210 is produced below each trench 105-1 to 105-5. Since the inversion layer 210 has a lower resistance than that of the well region 103, when a part of the current from the source region flows through the inversion layer 210, a small voltage drop is generated, thereby having a lower on-state resistance ($R_{ON}$) in the semiconductor device 100-1.

In addition, when the semiconductor device 100-1 is in an off state, the first doped regions 202a-1, 202a-2, 202a-5 and the adjacent second doped regions 204a-1, 204a-2, 204a-5 will produce a depletion region. Since the resistance of the depletion region is higher than that of the buried layer 102 and the well region 103, it is beneficial to increase the breakdown voltage ($V_{BR}$) of the semiconductor device 100-1.

Figure 8:
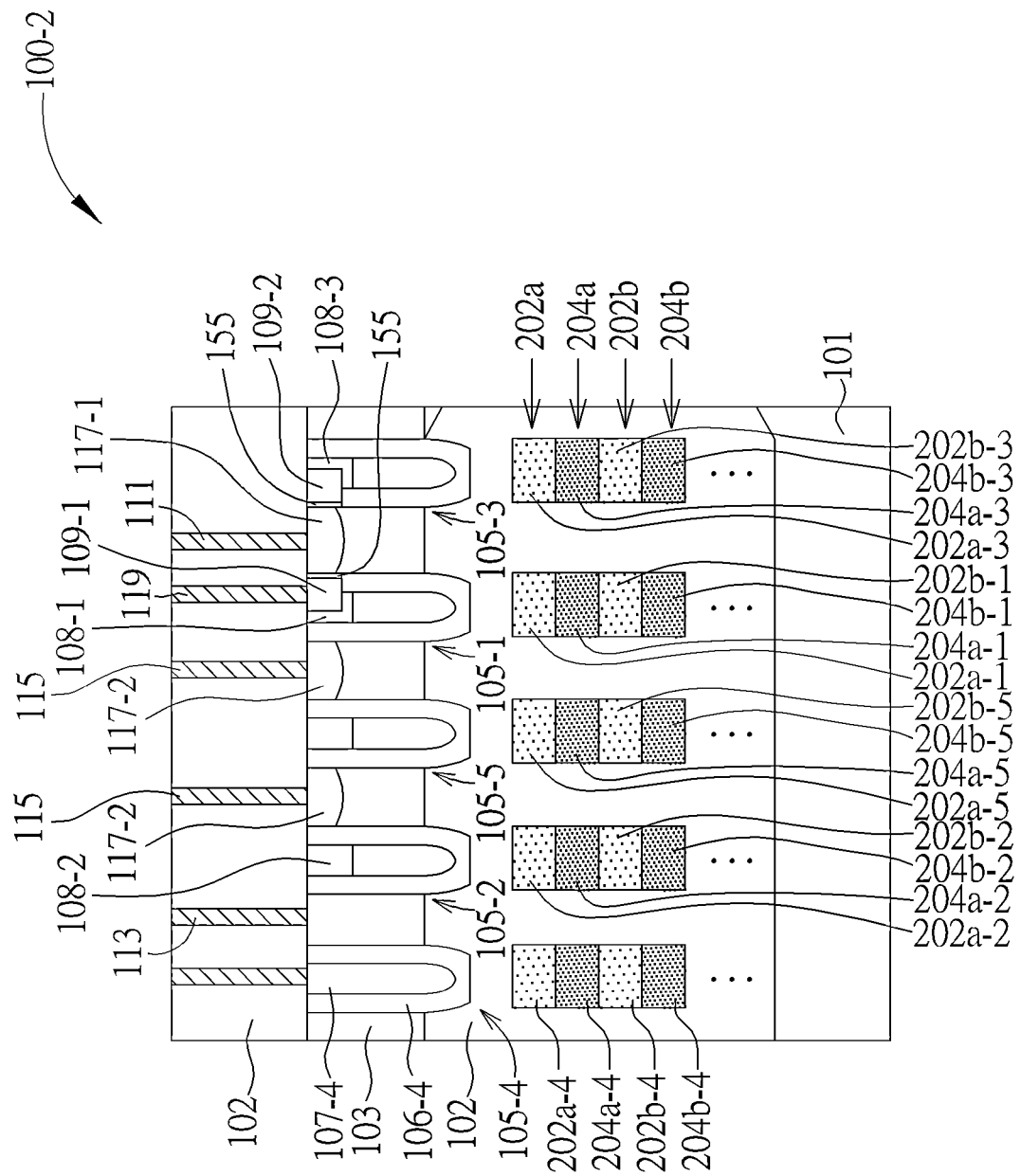
FIG. 8 is a schematic cross-sectional view of a semiconductor device according to another embodiment of the present disclosure.

FIG. 8 is a schematic cross-sectional view of a semiconductor device according to another embodiment of the present disclosure. As shown in FIG. 8, a semiconductor device 100-2 is similar to the semiconductor device 100-1 of FIG. 6. The main difference is that the semiconductor device 100-2 includes the first doped regions 202a-1 to 202a-5 arranged into the first row 202a, and further includes first doped regions 202b-1 to 202b-5 arranged into a third row 202b, or other first doped regions arranged into a 2n−1-th row, where n is an integer greater than 2, for example, includes a fifth row (not shown), a seventh row (not shown) . . . a 2n−1-th row, etc. In addition, the semiconductor device 100-2 includes the second doped regions 204a-1 to 204a-5 arranged into the second row 204a, and further includes second doped regions 204b-1 to 204b-5 arranged into a fourth row 204b, or other second doped regions arranged into a 2n-th row, where n is an integer greater than 2, for example, includes a sixth row (not shown), an eighth row (not shown) . . . a 2n-th row, etc.

In one embodiment, along the depth direction (such as the Z-axis direction) of the trenches 105-1 to 105-5, the rows of the first doped regions and the rows of the second doped regions are arranged alternately and the first doped regions arranged in the same row have substantially similar depths, and the second doped regions arranged in the same row also have substantially similar depths.

Similarly, through properly adjusting the ratio of the widths and the ratio of the doping concentrations between the first doped regions 202a-1 to 202a-5, 202b-1 to 202b-5 and the second doped regions 204a-1 to 204a-5, 204b-1 to 204b-5, the first doped regions 202a-1 to 202a-5, 202b-1 to 202b-5 and the second doped regions 204a-1 to 204a-5, 204b-1 to 204b-5 alternately arranged along the depth direction of the trenches (such as the Z-axis direction) will construct a super junction structure, which is beneficial to further reduce the on-state resistance ($R_{ON}$) and increase the breakdown voltage ($V_{BR}$) of the semiconductor device 100-2.

Figure 9:
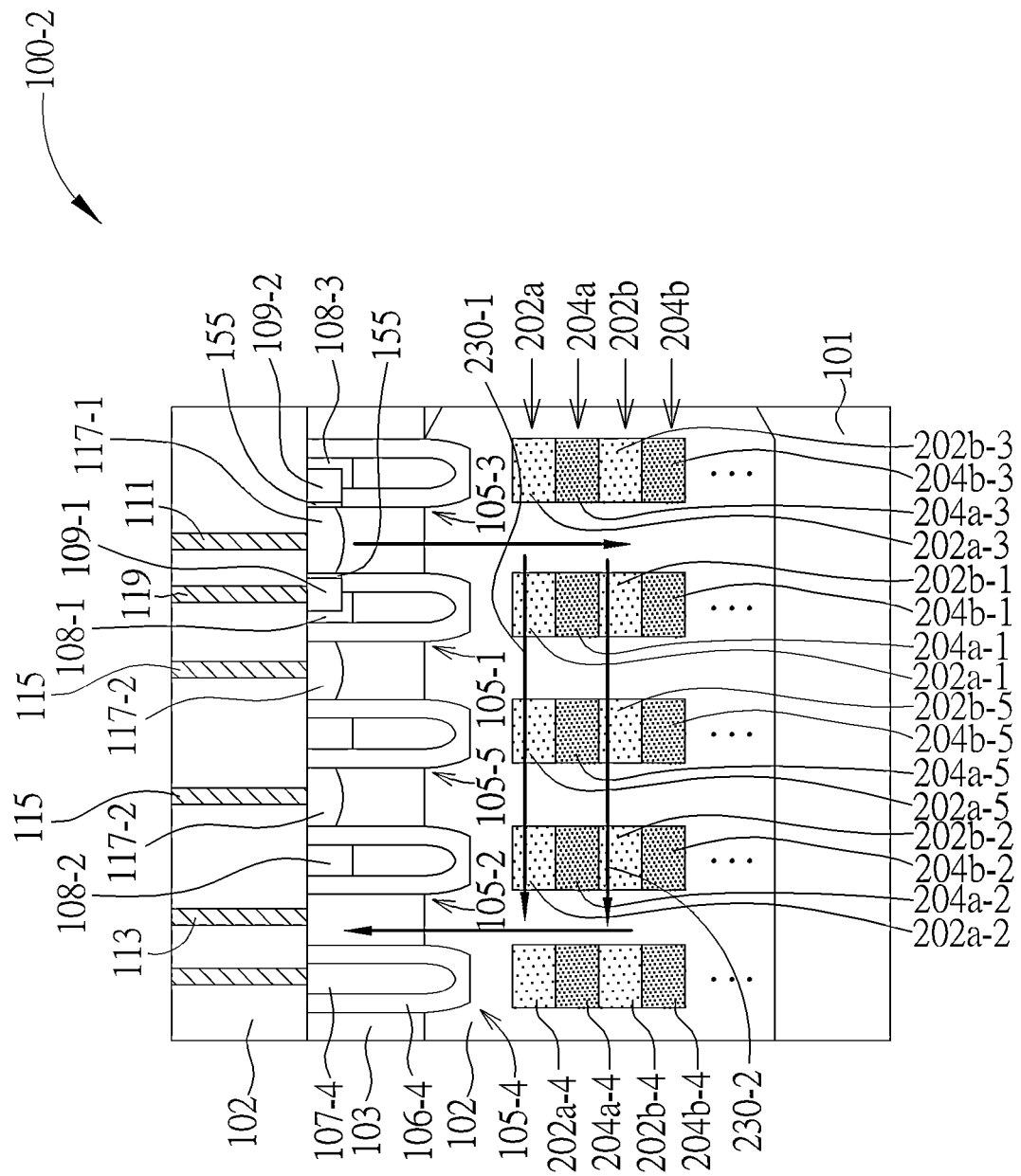
FIG. 9 is a schematic cross-sectional view of a semiconductor device in an on state according to another embodiment of the present disclosure.

FIG. 9 is a schematic cross-sectional view of a semiconductor device in an on state according to an embodiment of the present disclosure. As shown in FIG. 9, taking the semiconductor device 100-2 as an example, when the first gate electrode 109-1 is applied with a turn-on bias voltage and the semiconductor device 100-2 is in the on state, apart of the current 230-1 will flow from the source region (not shown), and then sequentially flow through the well region 103, the buried layer 102, the first doped region 202a-1, the buried layer 102, the first doped region 202a-5, the buried layer 102, the first doped region 202a-2, the buried layer 102, the well region 103, and finally flow to the drain region 113D (not shown). At the same time, another part of the current 230-2 will flow from the source region (not shown), and then sequentially flow through the well region 103, the buried layer 102, the first doped region 202b-1, the buried layer 102, the first doped region 202b-5, the buried layer 102, the first doped region 202b-2, the buried layer 102, the well region 103, and finally flow to the drain region 113D (not shown). Since the conductivity type of the first doped regions 202a-1, 202a-2, 202a-5, 202b-1, 202b-2, and 202b-5 is the same as that of the buried layer 102, and the average doping concentration of the first doped regions 202a-1, 202a-2, 202a-5, 202b-1, 202b-2, and 202b-5 is higher than that of the buried layer 102, compared with other semiconductor devices without the first doped regions 202a-1, 202a-2, 202a-5, 202b-1, 202b-2, 202b-5, the semiconductor device 100-2 may have a lower on-state resistance ($R_{ON}$). According to an embodiment, when the semiconductor device 100-2 is in the on state, a bias voltage (such as a positive bias voltage) may also be applied to each field plate in the trenches 105-1 to 105-5 at the same time, thereby producing an inversion layer below each trench 105-1 to 105-5. Since the inversion layer has a lower resistance than that of the well region 103, when a part of the current from the source region flows through the inversion layer, a small voltage drop is generated, there having a lower on-state resistance ($R_{ON}$) in the semiconductor device 100-2.

In addition, when the semiconductor device 100-2 is in an off state, a depletion region is generated in the adjacent rows 202a, 202b, 204a and 204b. Since the resistance of the depletion region is higher than that of the buried layer 102 and the well region 103, it is beneficial to improve the breakdown voltage ($V_{BR}$) of the semiconductor device 100-2.

Figure 10:
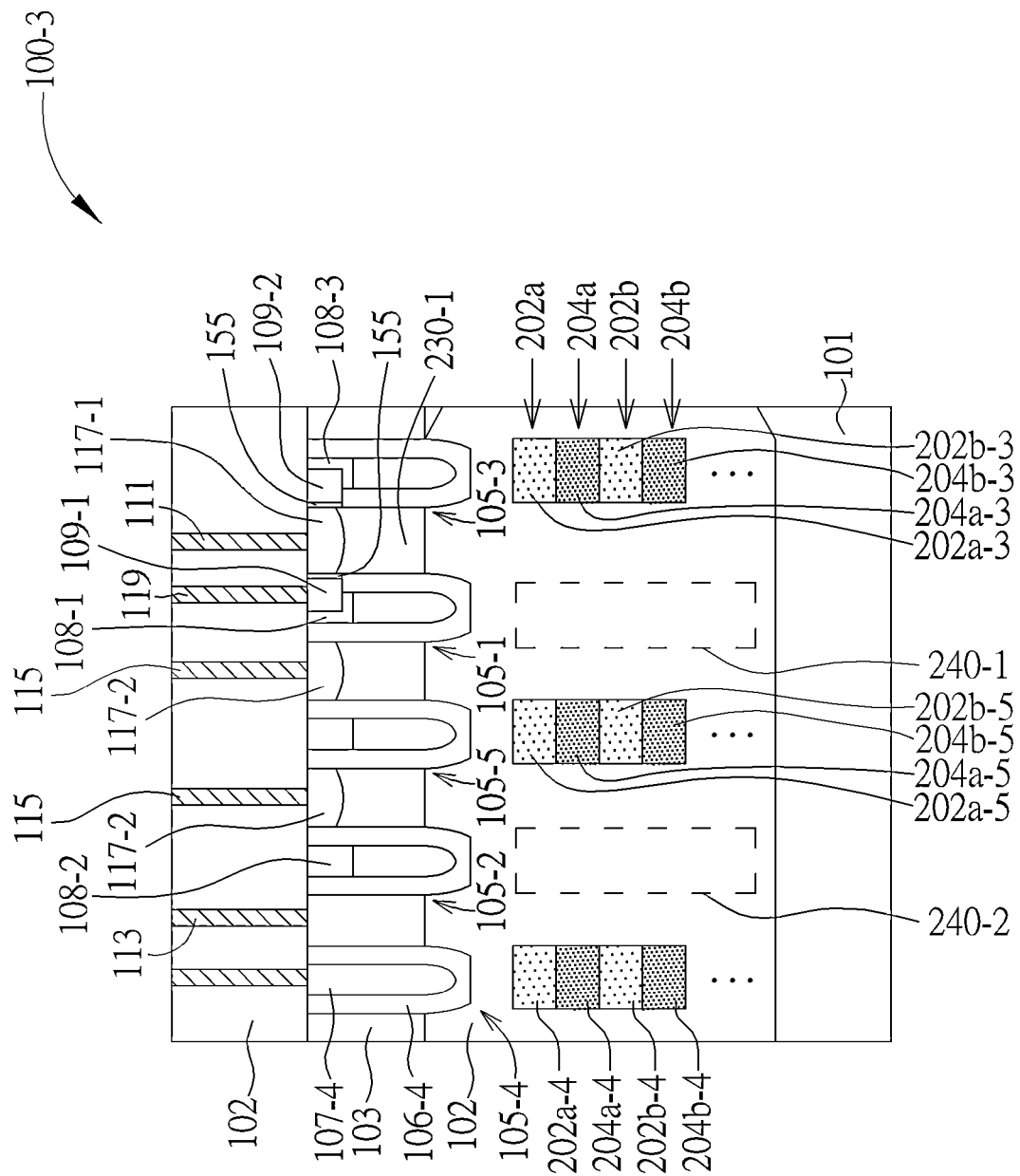
FIG. 10 is a schematic cross-sectional view of a semiconductor device according to another embodiment of the present disclosure.

FIG. 10 is a schematic cross-sectional view of a semiconductor device according to another embodiment of the present disclosure. As shown in FIG. 10, a semiconductor device 100-3 is similar to the semiconductor device 100-2 of FIG. 8. The main difference is that the second doped regions of the first conductivity type (such as p-type) and/or the first doped regions of the second conductivity type (such as n-type) will not be provided under the first trench 105-1 and the second trench 105-2 of the semiconductor device 100-3. In the semiconductor device 100-3, the second doped regions and the first doped regions are replaced by a first initial region 240-1 and a second initial region 240-2. The first initial region 240-1 is disposed under the first trench 105-1, and the second initial region 240-2 is disposed under the second trench 105-2. The first initial region 240-1 and the second initial region 240-2 may be a partial region of the buried layer 102, so that the overall conductivity type of the first initial region 240-1 and the second initial region 240-2 is the second conductivity type (such as n-type). Since there is no second doped region of the first conductivity type, where the current cannot pass through, disposed under the first trench 105-1 and the second trench 105-2, the current from the source electrode 111 or the drain electrode 113 is easier to flow into the wider deep region below the first trench 105-1 and the second trench 105-2, and then turn to flow through the first doped regions 202a-5 and 202b-5, which is beneficial to reduce the on-state resistance ($R_{ON}$) of the semiconductor device 100-3.

Figure 11:
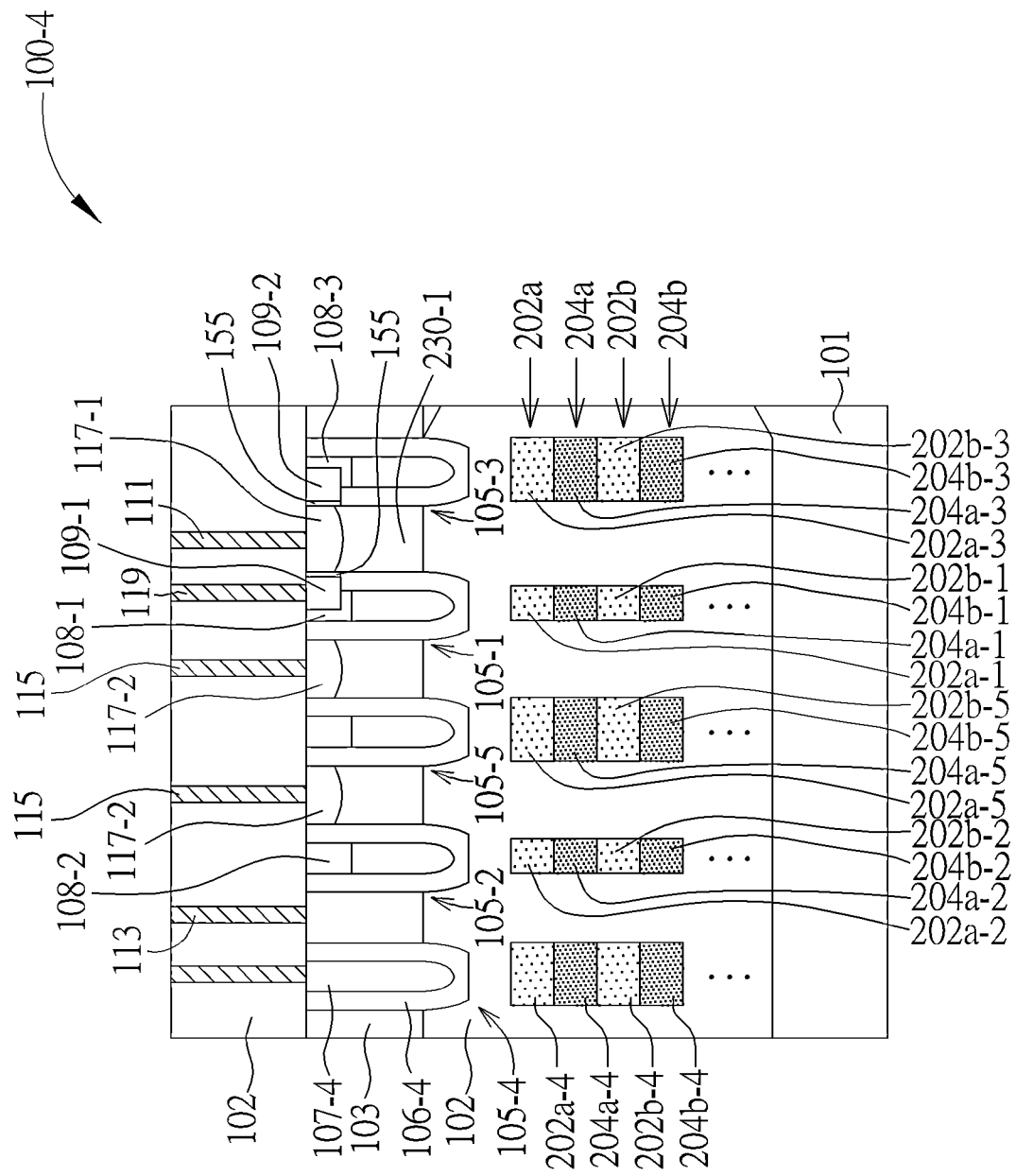
FIG. 11 is a schematic cross-sectional view of a semiconductor device according to another embodiment of the present disclosure.

FIG. 11 is a schematic cross-sectional view of a semiconductor device according to another embodiment of the present disclosure. As shown in FIG. 11, a semiconductor device 100-4 is similar to the semiconductor device 100-2 of FIG. 8. The main difference is that the average width (or a first average width) of the second doped regions 204a-1, 204a-2, 204b-1, 204b-2 disposed below the first trench 105-1 and the second trench 105-2 of the semiconductor element 100-4 is smaller than the average width (or a second average width) of the second doped regions 204a-5, 204b-5 disposed below the fifth trench 105-5. Since the widths of the second doped regions below the first trench 105-1 and the second trench 105-2 are narrow, the current from the source electrode 111 or the drain electrode 113 is easier to flow into the wider deep region below the first trench 105-1 and the second trench 105-2, and then turn to flow through the first doped regions 202a-5 and 202b-5, which is beneficial to reduce the on-state resistance ($R_{ON}$) of the semiconductor device 100-4.

Figure 12:
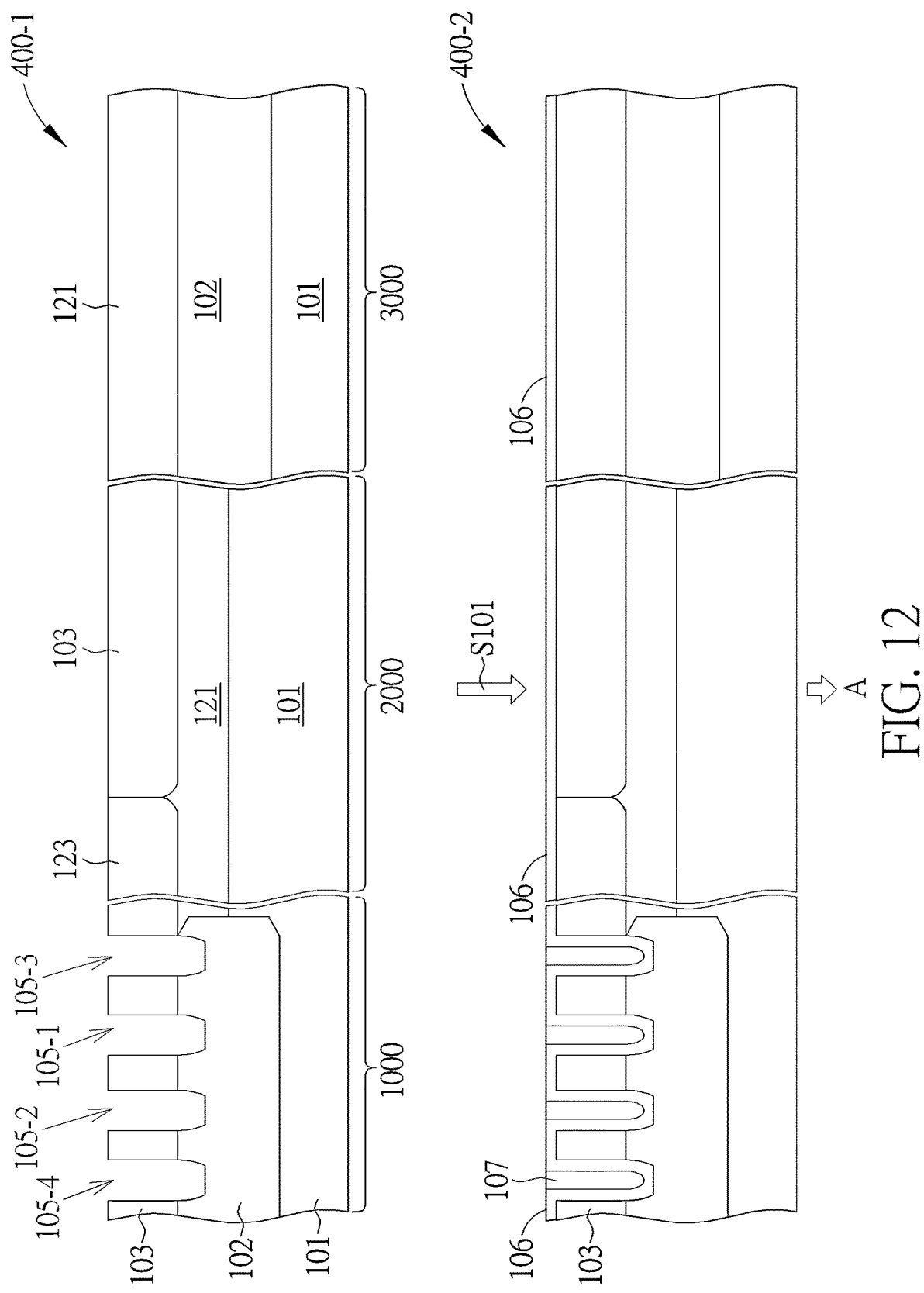
FIG. 12, FIG. 13, FIG. 14, FIG. 15 and FIG. 16 are schematic cross-sectional views of various stages of a method of fabricating an integrated circuit structure according to an embodiment of the present disclosure, where the integrated circuit structure includes three discontinuous semiconductor device regions.

FIG. 12, FIG. 13, FIG. 14, FIG. 15 and FIG. 16 are schematic cross-sectional views of various stages of a method of fabricating an integrated circuit structure according to an embodiment of the present disclosure, where the integrated circuit structure includes three discontinuous semiconductor device regions. Referring to FIG. 12, an integrated circuit structure of an embodiment of the present disclosure includes at least three discontinuous semiconductor device regions that are the region of a semiconductor device 100 (hereinafter referred to as the first region) and the region of a semiconductor device 200 (hereinafter referred to as the second region) and the region of a semiconductor device 300 (hereinafter referred to as the third region). The semiconductor device 100 may be any one of the aforementioned embodiments as shown in FIG. 1 to FIG. 5, and is illustrated by the semiconductor device 100 of FIG. 2 as an example. The semiconductor device 200 is, for example, a LDMOS device, and the semiconductor element 300 is, for example, a CMOS device.

Referring to FIG. 12, firstly, as shown in a cross-sectional structure 400-1, a substrate 101 of a first conductivity type, such as a p-type substrate, is provided. A buried layer 102 of a second conductivity type, such as an n-type buried layer, is formed in the first region 1000 and the third region 3000 of the substrate 101, and then an epitaxial layer 121 of the first conductivity type, such as a p-type epitaxial layer, is formed on the substrate 101, where the epitaxial layer 121 covers the buried layer 102. Next, a patterned mask is formed by a photolithography process to cover the third region, and then several well regions 103 of the second conductivity type are simultaneously formed in the epitaxial layers 121 of the first region 1000 and the second region 2000 by the same ion implantation process. Then, the patterned mask covering the third region is removed. Next, a patterned mask covering the first region 1000 and the third region 3000 is formed, and then a well region 123 of the first conductivity type is formed in the epitaxial layer 121 of the second region 2000 by another ion implantation process. Thereafter, a patterned hard mask is formed and used as an etching mask, and an etching process is performed to form a third trench 105-3, a first trench 105-1, a second trench 105-2 and a fourth trench 105-4 that are arranged in sequence from right to left in the well region 103 of the first region 1000. Still referring to FIG. 12, as shown in a cross-sectional structure 400-2, at step S101, a dielectric layer 106 is conformally formed in each trench of the first region 1000, on the well region 103 and the well region 123 of the second region 2000, and on the epitaxial layer 121 of the third region 3000 by a deposition process. Then, each trench in the first region 1000 is filled up with a conductive layer 107 by a deposition process and a chemical mechanical planarization (CMP) process, so that the top surface of the conductive layer 107 and the top surface of the dielectric layer 106 are on the same plane. The conductive layer 107 is, for example, polysilicon, but not limited thereto.

Figure 13:
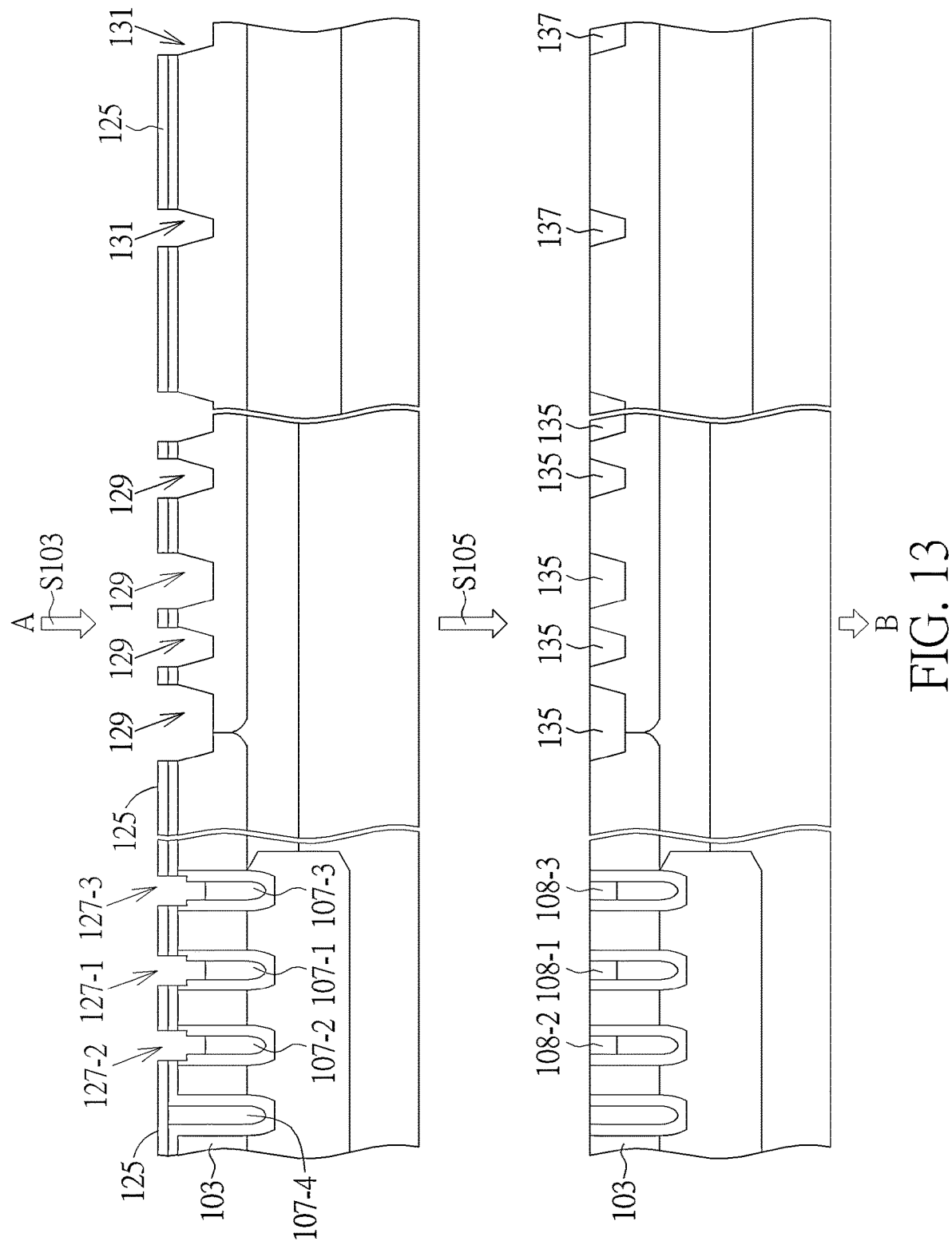

Next, referring to FIG. 13, at step S103, a patterned hard mask 125 is formed in the first region, the second region and the third region. The openings of the patterned hard mask 125 in the first region correspond to the third trench 105-3, the first trench 105-1 and the second trench 105-2. The openings of the patterned hard mask 125 in the second region and the third region correspond to the predetermined regions where several trenches are subsequently formed. Using the patterned hard mask 125 as an etching mask, the top portion of the conductive layer 107 and the top portion of the dielectric layer 106 in the third trench 105-3, the first trench 105-1 and the second trench 105-2 are removed at the same time by the same etching process, so that a third recess 127-3 is formed on a third field plate 107-3 in the third trench 105-3, a first recess 127-1 is formed on a first field plate 107-1 in the first trench 105-1, and a second recess 127-2 is formed on a second field plate 107-2 in the second trench 105-2. Meanwhile, multiple trenches 129 are formed in the second region, and multiple trenches 131 are formed in the third region by the aforementioned etching process. Still referring to FIG. 13, at step S105, the third recess 127-3, the first recess 127-1 and the second recess 127-2 in the first region are filled up with a dielectric material by the same deposition and CMP processes to form a third dielectric isolation portion 108-3, a first dielectric isolation portion 108-1 and a second dielectric isolation portion 108-2, respectively. Meanwhile, the trenches 129 in the second region and the trenches 131 in the third region are filled up with the dielectric material to form multiple shallow trench isolation (STI) structures 135 in the second region and multiple STI structures 137 in the third region by the aforementioned deposition and CMP processes.

Figure 14:
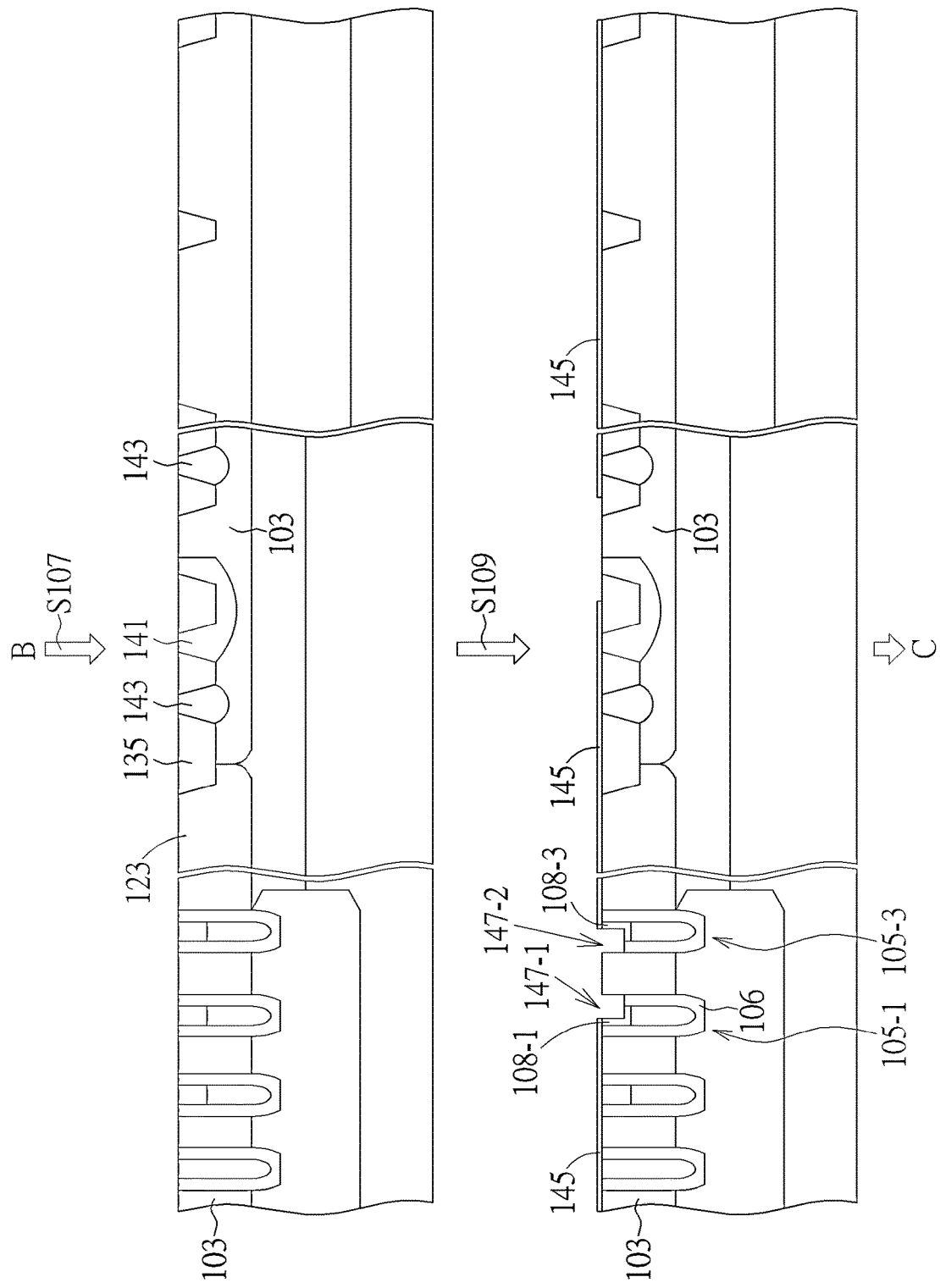

Then, referring to FIG. 14, at step S107, a patterned mask is formed to cover a predetermined region, and an ion implantation process of the first conductivity type is performed in the second region to form a doped region 141 in the well region 103 of the second conductivity type. The doped region 141 is, for example, a p-type doped region. Then, the patterned mask covering the predetermined region is removed. Next, another patterned mask is formed to cover another predetermined region, and an ion implantation process of the second conductivity type is performed in the second region to form a doped region 143 in the well region 103 of the second conductivity type. The doped region 143 is for example, an n-type doped region. Still referring to FIG. 14, at step S109, a patterned hard mask 145 is formed in the first region, the second region and the third region. The openings of the patterned hard mask 145 in the first region correspond to the third trench 105-3 and the first trench 105-1. A portion of the first dielectric isolation portion 108-1 and a portion of the dielectric layer 106 in the first trench 105-1 in the first region are removed by an etching process to form a first groove 147-1. Meanwhile, a portion of the third dielectric isolation portion 108-3 and a portion of the dielectric layer 106 in the third trench 105-3 are removed by the same etching process to form a second groove 147-2.

Figure 15:
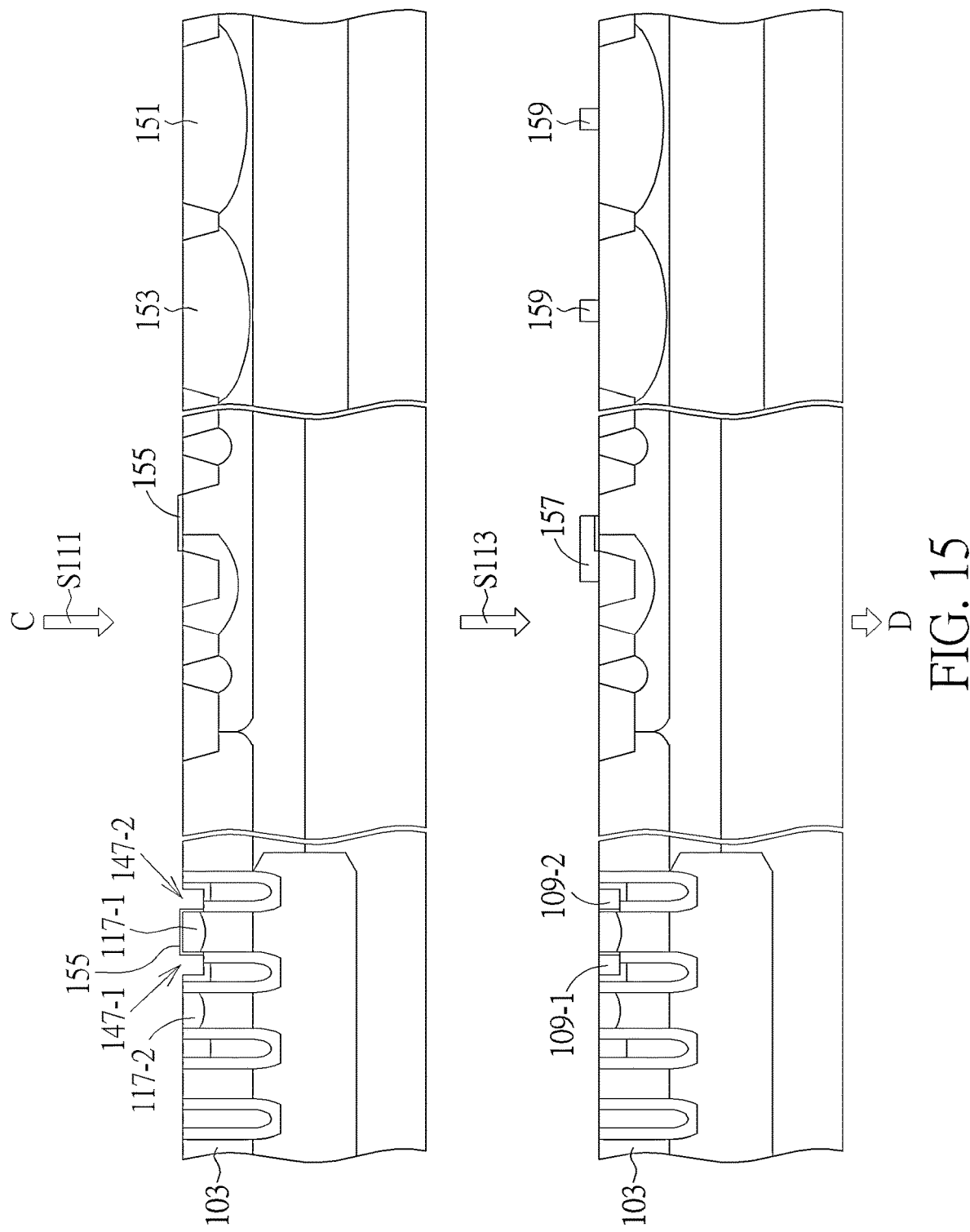

Next, referring to FIG. 15, at step S111, a gate dielectric layer 155 is formed in the second region by a thermal oxidation process through the opening of the patterned hard mask 145 in the second region (as shown in FIG. 14). Meanwhile, another gate dielectric layer 155 is formed on the well region 103 between the third trench 105-3 and the first trench 105-1 in the first region by the aforementioned thermal oxidation process. Thereafter, the patterned hard mask 145 is removed, and then a first body region 117-1 and a second body region 117-2 (for example, both are p-type body regions) are formed in the first region by an ion implantation process of the first conductive type. Meanwhile, a well region 151 of the first conductive type (for example, a p-type well region) is formed in the third region by the aforementioned ion implantation process. Then, a well region 153 of the second conductive type (for example, an n-type well region) is formed in the third region by an ion implantation process of the second conductive type. Still referring to FIG. 15, at step S113, a first gate 109-1 is formed in the first groove 147-1 in the first region and a second gate 109-2 is formed in the second groove 147-2 in the first region by a deposition process and a CMP process. Meanwhile, a gate 157 is formed in the second region and multiple gates 159 are formed in the third region by the aforementioned deposition process and another etching process. The first gate 109-1, the second gate 109-2, the gate 157 and the gates 159 all are formed of the same conductive material layer, for example a polysilicon layer. The conductive material layer used to form the first gate 109-1, the second gate 109-2, the gate 157 and the gates 159 is formed by the same deposition process.

Figure 16:
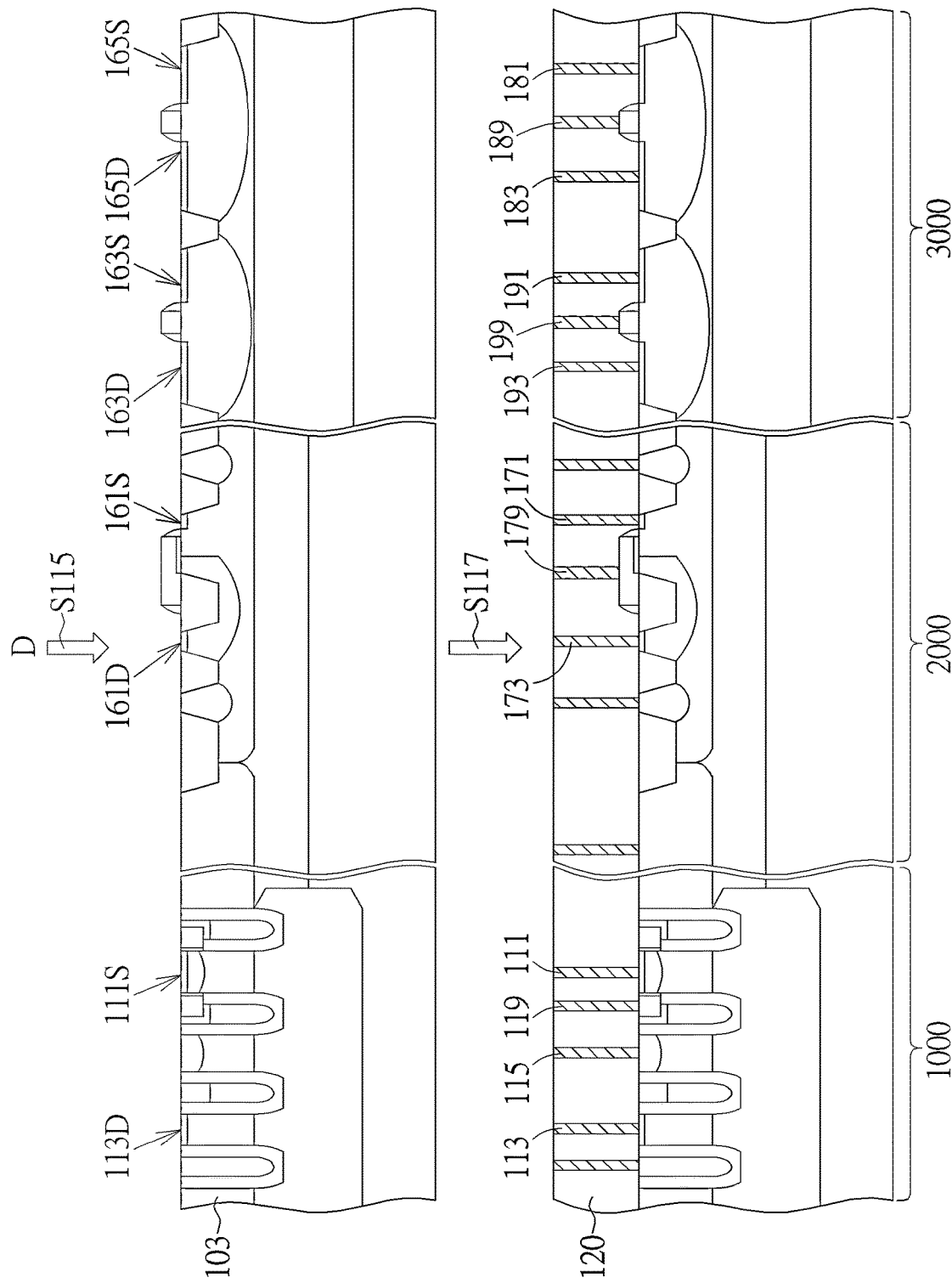

Then, referring to FIG. 16, at step S115, through the same ion implantation process of the second conductivity type, a source region 111S and a drain region 113D are formed in the first region, and a source region 165S and a drain region 165D are formed in the third region. The source region 111S, the drain region 113D, the source region 165S, and the drain region 165D all are for example, n-type heavily doped regions. Meanwhile, other required doped regions of the second conductivity type (for example, n-type heavily doped regions) may also be formed in the second region by the same ion implantation process. Moreover, through the same ion implantation process of the first conductivity type, a source region 161S and a drain region 161D are formed in the second region, and a source region 163S and a drain region 163D are formed in the third region. The source region 161S, the drain region 161D, the source region 163S and the drain region 163D all are for example, p-type heavily doped regions. Meanwhile, other required doped regions of the first conductivity type (for example, p-type heavily doped regions) may also be formed in the first region by the same ion implantation process.

Still referring to FIG. 16, at step S117, an interlayer dielectric (ILD) layer 120 is formed in the first region, the second region and the third region at the same time. Then, several contact openings are formed in the ILD layer 120 in the first region, the second region and the third region at the same time by photolithography and etching processes. Next, a source electrode 111, a gate contact 119, a field plate contact 115 and a drain electrode 113 are formed in the first region by a deposition process and a CMP process. Meanwhile, a source electrode 171, a gate contact 179 and a drain electrode 173 are formed in the second region by the same deposition and CMP processes. Source electrodes 181 and 191, gate contacts 189 and 199, and drain electrodes 183 and 193 are also formed in the third region at the same time by the same deposition and CMP processes. In addition, other required contacts may also be formed in the ILD layer 120 in the first, second and third regions at the same time by the same deposition and CMP processes, so as to simultaneously complete the fabrication of the semiconductor devices 100, 200 and 300. According to the embodiments of the present disclosure, it is advantageous to use a power integrated circuit process integration technology such as a Bipolar-CMOS-DMOS (BCD) process to fabricate an integrated circuit structure including the semiconductor device 100, the semiconductor device 200 and the semiconductor device 300.

Figure 17:
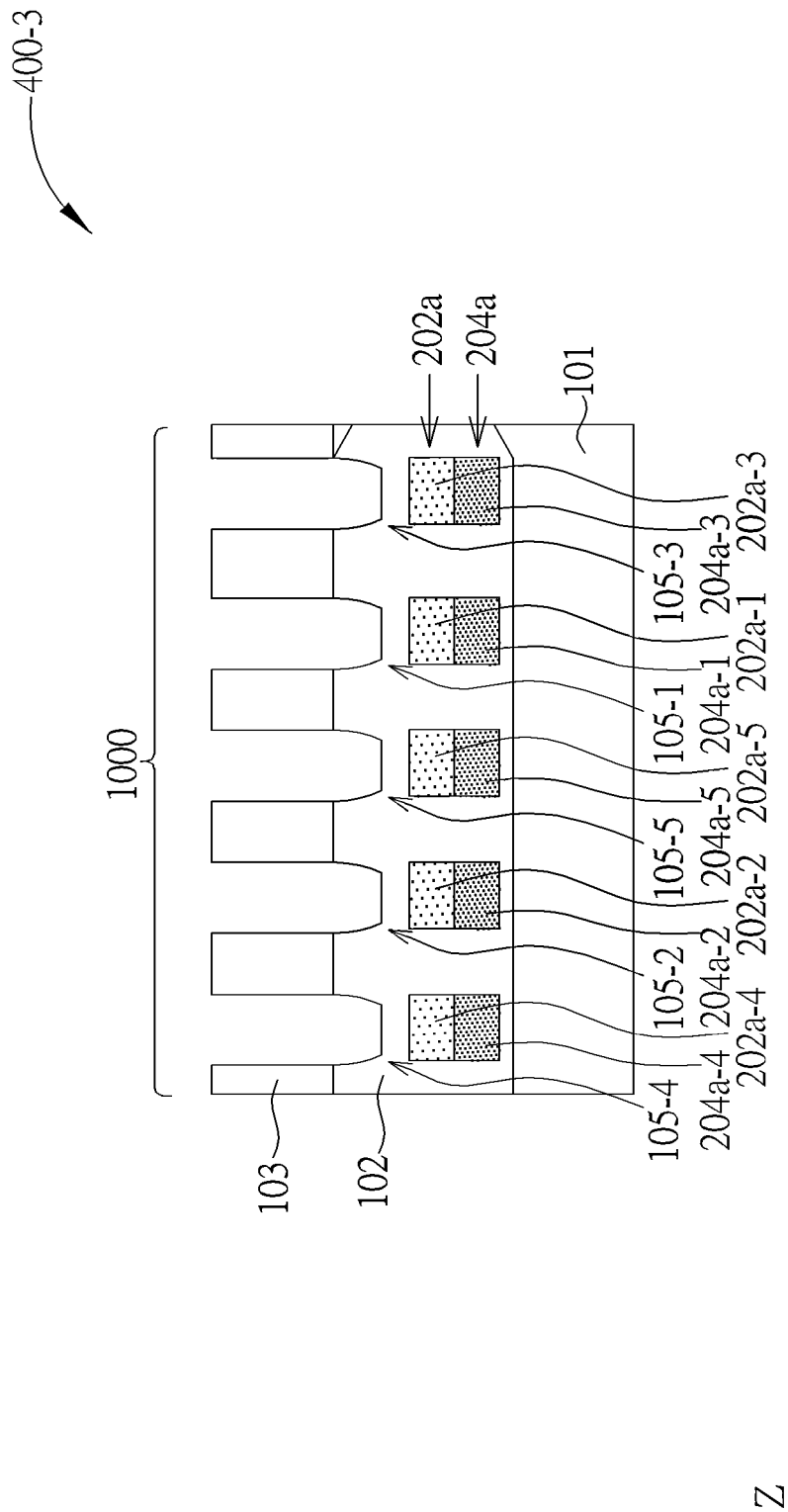
FIG. 17 is a schematic cross-sectional view of one stage of a method of fabricating an integrated circuit structure according to another embodiment of the present disclosure, where the integrated circuit structure includes two rows of doped regions disposed below trenches.
Figure 18:
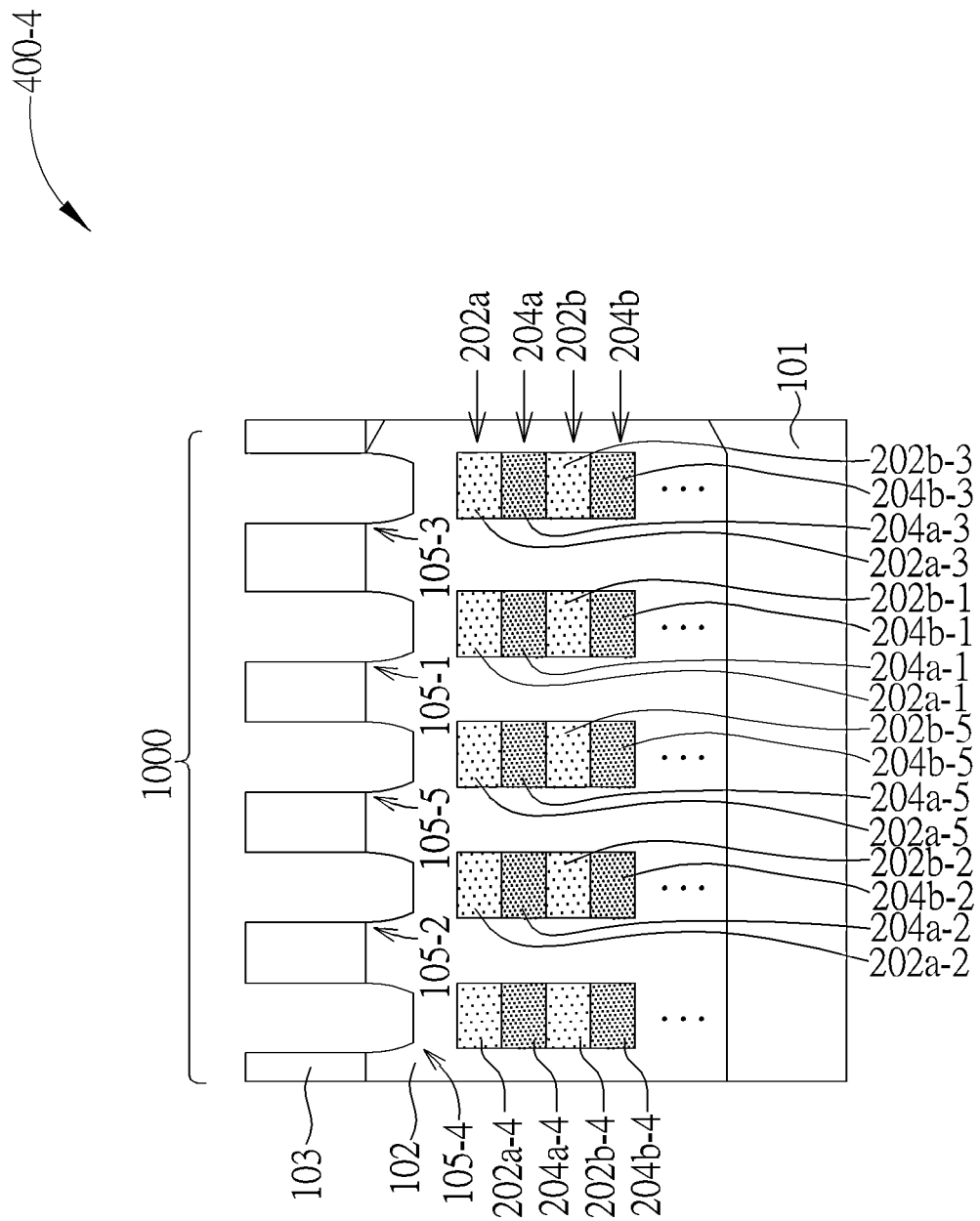
FIG. 18 is a schematic cross-sectional view of one stage of a method of fabricating an integrated circuit structure according to another embodiment of the present disclosure, where the integrated circuit structure includes more than four rows of doped regions disposed below trenches.
Figure 19:
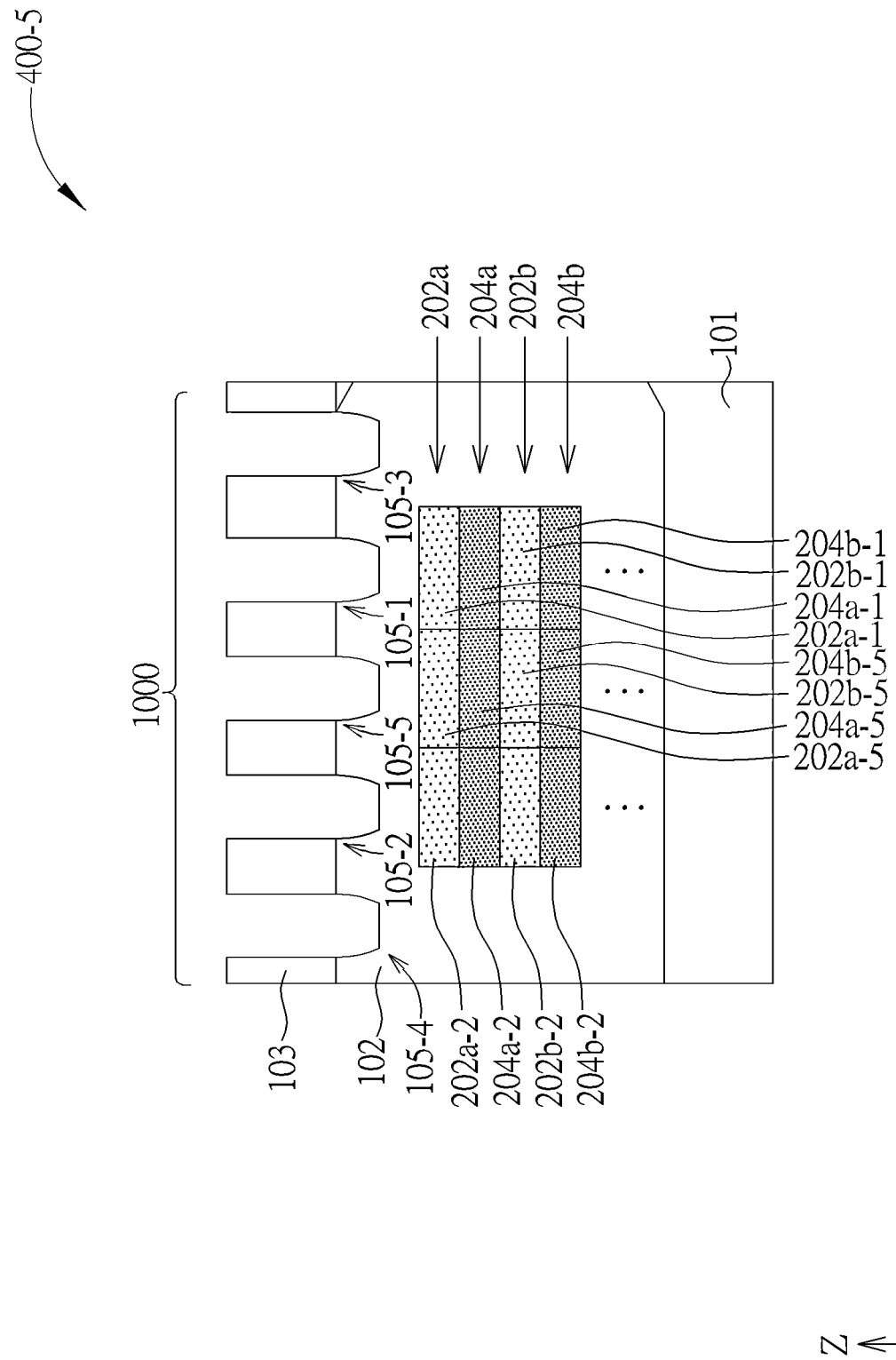
FIG. 19 is a schematic cross-sectional view of one stage of a method of fabricating an integrated circuit structure according to another embodiment of the present disclosure, where the integrated circuit structure includes doped regions laterally adjacent to each other and disposed below trenches.

According to an embodiment of the present disclosure, before performing the step S101 as shown in FIG. 12, a self-aligned doping process may be additionally performed to form doped regions of the second conductivity type under each of the trenches 105-1 to 105-3, thereby forming structures similar to those shown in FIG. 17, FIG. 18 and FIG. 19.

As shown in FIG. 17, a cross-sectional structure 400-3 of FIG. 17 substantially corresponds to the first region 1000 of the cross-sectional structure 400-1 of FIG. 12. The main difference is that the cross-sectional structure 400-3 further includes a fifth trench 105-5 disposed between the first trench 105-1 and the second trench 105-2. In addition, first doped regions 202a-1, 202a-2, 202a-5 and second doped regions 204a-1, 204a-2, 204a-5 are formed under the first trench 105-1, the second trench 105-2 and the fifth trench 105-5. The first doped regions 202a-1, 202a-2, 202a-5 have the second conductivity type (for example, n-type), and the second doped regions 204a-1, 204a-2, 204a-5 have the first conductivity type (for example, p-type). Moreover, the projections of the first doped regions 202a-1, 202a-2, 202a-5 in a first direction (such as the X-axis direction) are overlapped with each other, and the projections of the second doped regions 204a-1, 204a-2, and 204a-5 in the first direction (such as the X-axis direction) are overlapped with each other. According to an embodiment, first doped regions 202a-3, 202a-4 and second doped regions 204a-3, 204a-4 are further formed under the third trench 105-3 and the fourth trench 105-4.

For the cross-sectional structure 400-3 as shown in FIG. 17, the fabrication process thereof is performed before the step of filling the conductive layer 107 on the dielectric layer 106 as shown in FIG. 12, and the fabrication process thereof is illustrated as follows. Firstly, referring to FIG. 17, a fifth trench 105-5 is formed in the well region 103 and located between the first trench 105-1 and the second trench 105-2. Afterwards, a self-aligned doping process is performed to form the first doped regions 202a-1, 202a-2, 202a-5 and the second doped regions 204a-1, 204a-2, 204a-5 under the first trench 105-1, the second trench 105-2 and the fifth trench 105-5. According to an embodiment, the second doped regions 204a-1, 204a-2, 204a-5 may be formed firstly, and then the first doped regions 202a-1, 202a-2, 202a-5 are formed, but not limited thereto. Since the doped regions under each trench are formed by performing the self-aligned doping process, the photolithography process is omitted, thereby effectively reducing the fabrication cost.

As shown in FIG. 18, a cross-sectional structure 400-4 of FIG. 18 is similar to the cross-sectional structure 400-3 of FIG. 17. The main difference is that the cross-sectional structure 400-4 includes the first doped regions 202a-1 to 202a-5 arranged into a first row 202a, and further includes the first doped regions 202b-1 to 202b-5 arranged into a third row 202b, or other first doped regions arranged into a 2n−1-th row, where n is an integer greater than 2, for example, includes a fifth row (not shown), a seventh row (not shown) . . . a 2n−1-th row, etc. In addition, the cross-sectional structure 400-4 includes the second doped regions 204a-1 to 204a-5 arranged into a second row 204a, and further includes the second doped regions 204b-1 to 204b-5 arranged into a fourth row 204b, or other second doped regions arranged into a 2n-th row, where n is an integer greater than 2, for example, includes a sixth row (not shown), an eighth row (not shown) . . . a 2n-th row, etc. According to an embodiment, along the depth direction of each trench (such as the Z-axis direction), the rows 202a, 202b of the first doped regions 202a-1 to 202a-5, 202b-1 to 202b-5, and the rows 204a, 204b of the second doped regions 204a-1 to 204a-5, 204b-1 to 204b-5 are arranged alternately.

For the cross-sectional structure 400-4 as shown in FIG. 18, the fabrication process thereof is performed before the step of filling the conductive layer 107 on the dielectric layer 106 as shown in FIG. 12, and the fabrication process thereof includes performing multiple self-aligned doping processes to form the 2n-th row, the 2n−1-th row . . . the fourth row 204b, the third row 202b, the second row 204a, and the first row 202a in sequence, but the order of forming the rows is not limited thereto.

As shown in FIG. 19, a cross-sectional structure 400-5 of FIG. 19 is similar to the cross-sectional structure 400-4 of FIG. 18. The main difference is that there is no second doped region under the third trench 105-3 and the fourth trench 105-4 of the cross-sectional structure 400-5, and the adjacent doped regions in the same row 202a, 202b, 204a, 204b are in contact with each other. For the cross-sectional structure 400-5 as shown in FIG. 19, the fabrication process thereof is performed before the step of filling the conductive layer 107 on the dielectric layer 106 as shown in FIG. 12. The fabrication process of the cross-sectional structure 400-5 includes performing multiple self-aligned doping processes to sequentially form each row, and further includes performing at least one heat treatment process, so that the adjacent first doped regions 202a-1, 202a-2, 202a-5, 202b-1, 202b-2, 202b-5 in the same row are in contact with each other, and the adjacent second doped regions 204a-1, 204a-2, 204a-5, 204b-1, 204b-2, 204b-5 in the same row are also in contact with each other. After the heat treatment process is performed, the first doped regions 202a-1, 202a-2, 202a-5, 202b-1, 202b-2, 202b-5 and the second doped regions 204a-1, 204a-2, 204a-5, 204b-1, 204b-2, 204b-5 have the same average doping concentration.

FIG. 20 is a schematic diagram illustrating distributions of voltage equipotential lines of a semiconductor device in an off state and in an on state according to an embodiment of the present disclosure. The semiconductor device 100 of FIG. 1 is illustrated as an example, as shown in FIG. 20, when the semiconductor device is in the off state, the distribution 100-off of voltage equipotential lines shows that the first field plate 107-1 and the second field plate 107-2 are used to spread the voltage on both sides of each trench to generate a uniform voltage drop, thereby avoiding a high-intensity electric field in a local area. Furthermore, when the numbers of trenches and field plates are increased, the breakdown voltage is further increased. Still referring to FIG. 20, when the semiconductor device is in the on state, the first gate 109-1 is applied with an on-state bias voltage (for example, a positive potential), and the first field plate 107-1 and the second field plate 107-2 are also applied with a field plate potential (for example, a positive potential), the distribution 100-on of voltage equipotential lines shows that a higher voltage (for example, close to HV) is near the drain electrode 113 and a lower voltage (for example, close to 0V) is near the source electrode 111. In addition, a current path 110 is illustrated by flowing from the drain electrode 113 downward along the second side 20 of the second trench 105-2 to below the second trench 105-2 and to below the first trench 105-1, and then flowing upward along the first side 10 of the first trench 105-1 to a channel region (not shown) and the source electrode 111, so as to present a U-shaped current path. In this way, the current path is reduced and the depth of trench is reduced (compared to the depth of conventional trench is reduced by about 30% to 50%) without compromising the withstand voltage capability, thereby reducing the difficulty of the process, and reducing the on-state resistance of semiconductor devices at the same time. In addition, according to the embodiments of the present disclosure, through the arrangement of multiple trench field plates, the output power capacitance (Coss) of the semiconductor device is reduced, and the breakdown voltage of the semiconductor device is increased (about 100V to 150V). Moreover, through the arrangement of multiple gates, the gate-to-drain charge (Qgd) and the gate-to-drain capacitance (Cgd) of the semiconductor device are reduced, thereby improving the switching speed of the semiconductor devices of the present disclosure, and satisfying various electrical requirements of integrated circuits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate, having a first conductivity type;
    a well region, having a second conductivity type and disposed on the substrate;
    a first trench, disposed in the well region;
    a first field plate and a first dielectric layer, disposed in the first trench, and the first dielectric layer surrounding the first field plate;
    a second trench, disposed in the well region;
    a second field plate and a second dielectric layer, disposed in the second trench, and the second dielectric layer surrounding the second field plate;
    a first gate, disposed above the first field plate;
    a source electrode, disposed on a first side of the first trench; and
    a drain electrode, disposed on a second side of the second trench,
    wherein the source electrode, the first trench, the second trench and the drain electrode are arranged in sequence along a first direction.

2. The semiconductor device of claim 1, wherein when the first gate is applied with an on-state bias voltage, a current is allowed to flow from the drain electrode downward along the second side of the second trench to below the second trench, next to below the first trench, and then upward along the first side of the first trench to the source electrode.

3. The semiconductor device of claim 1, wherein the first gate is disposed in the first trench and separated from the first field plate by a first dielectric isolation portion, and the first dielectric isolation portion is disposed on the first field plate.

4. The semiconductor device of claim 1, further comprising:
    a third trench, disposed in the well region, wherein a third field plate and a third dielectric layer surrounding the third field plate are disposed in the third trench; and
    a second gate, disposed in the third trench and separated from the third field plate by a third dielectric isolation portion, wherein the third dielectric isolation portion is disposed on the third field plate, and the source electrode is disposed between the first trench and the third trench.

5. The semiconductor device of claim 4, wherein the third trench, the source electrode, the first trench, the second trench and the drain electrode are arranged in sequence along the first direction.

6. The semiconductor device of claim 1, further comprising a first body region having the first conductivity type and disposed on the first side of the first trench, wherein a bottom surface of the first body region is higher than a top surface of the first field plate.

7. The semiconductor device of claim 1, further comprising a second body region having the first conductivity type and disposed between the first trench and the second trench, wherein a bottom surface of the second body region is higher than a top surface of the first field plate.

8. The semiconductor device of claim 1, further comprising a fourth trench disposed in the well region, wherein a fourth field plate and a fourth dielectric layer surrounding the fourth field plate are disposed in the fourth trench, the drain electrode is disposed between the fourth trench and the second trench, and the source electrode, the first trench, the second trench, the drain electrode and the fourth trench are arranged in sequence along the first direction.

9. The semiconductor device of claim 1, wherein a potential of the first field plate is the same as the potential of the first gate or the source electrode.

10. The semiconductor device of claim 1, wherein the first gate and the first field plate are connected to each other and are respectively formed of different regions of a same conductive layer in the first trench.

11. The semiconductor device of claim 10, further comprising a first body region and a second body region, having the first conductivity type and disposed in the well region along two opposite sides of the first trench, and extended from the height of a top of the first trench downward to 3% to 60% of the depth of the first trench.

12. The semiconductor device of claim 1, further comprising:
    a gate connecting portion, extending from a sidewall of the first gate along the first direction, protruding beyond the sidewall of the first gate, and disposed on the well region; and
    a body region, having the first conductivity type and disposed below the gate connecting portion.

13. The semiconductor device of claim 12, further comprising:
    a third trench, disposed in the well region, wherein a third field plate, a third dielectric layer and a third dielectric isolation portion are disposed in the third trench, the third dielectric layer surrounds the third field plate, and the third dielectric isolation portion covers the third field plate;
    a second gate, disposed on a top surface of the third dielectric isolation portion and on the well region; and
    a source region, located between the first trench, the third trench and the gate connecting portion, wherein two sides of the source region are respectively adjacent to the first trench and the gate connecting portion, and wherein the gate connecting portion is disposed between the first gate and the second gate, and the body region is extended to below the source region.

14. The semiconductor device of claim 13, wherein the first gate and the second gate are extended along a second direction, and the first direction and the second direction have an included angle of non-zero degrees.

15. The semiconductor device of claim 12, further comprising a first dielectric isolation portion disposed in the first trench and covering the first field plate, wherein the first gate is disposed on a top surface of the first dielectric isolation portion and on the well region.

16. The semiconductor device of claim 1, further comprising an epitaxial layer having the first conductivity type and disposed on the substrate, wherein the well region is disposed in the epitaxial layer.

17. The semiconductor device of claim 1, further comprising a buried layer having the second conductivity type and disposed under the well region, wherein the first trench and the second trench are extended into the buried layer.

18. The semiconductor device of claim 2, further comprising:
- a fifth trench, disposed in the well region and between the first trench and the second trench;
- a plurality of first doped regions, disposed under the first trench, the second trench and the fifth trench, respectively, wherein the plurality of first doped regions have the second conductivity type; and
- a plurality of second doped regions, disposed under the plurality of first doped regions, respectively, wherein the plurality of second doped regions have the first conductivity type,
- wherein along a depth direction of the trenches, projections of the plurality of first doped regions partially overlap with projections of the first trench, the second trench and the fifth trench, respectively,
- wherein along the depth direction of the trenches, projections of the plurality of second doped regions partially overlap with the projections of the first trench, the second trench and the fifth trench, respectively, and
- when the first gate is applied with the on-state bias voltage, the current flows through the plurality of first doped regions.

19. The semiconductor device of claim 18, wherein the plurality of first doped regions are arranged into a first row and a third row, and the plurality of second doped regions are arranged into a second row and a fourth row, along the depth direction of the trenches, the rows of the plurality of first doped regions and the rows of the plurality of second doped regions are arranged alternately, the plurality of first doped regions arranged in the same row have the same depth, and the plurality of second doped regions arranged in the same row have the same depth.

20. The semiconductor device of claim 2, further comprising:
- a fifth trench, disposed in the well region and between the first trench and the second trench;
- a first doped region, disposed under the fifth trench, wherein the first doped region has the second conductivity type; and
- a second doped region, disposed under the first doped region, wherein the second doped region has the first conductivity type,
- wherein along a depth direction of the fifth trench, a projection of the fifth trench, a projection of the first doped region and a projection of the second doped region partially overlap with each other, and
- when the first gate is applied with the on-state bias voltage, the current flows through the first doped region.

* * * * *